(12) United States Patent
Park et al.

(10) Patent No.: US 12,262,496 B2
(45) Date of Patent: Mar. 25, 2025

(54) TRAY SUPPORT STRUCTURE AND ELECTRONIC DEVICE INCLUDING THE SAME

(71) Applicant: SAMSUNG ELECTRONICS CO., LTD., Suwon-si (KR)

(72) Inventors: Sukchul Park, Suwon-si (KR); Beommo Seong, Suwon-si (KR); Sanghoon Jung, Suwon-si (KR); Woonbae Kim, Suwon-si (KR); Jinsu Park, Suwon-si (KR); Byounguk Yoon, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 157 days.

(21) Appl. No.: 17/974,002

(22) Filed: Oct. 26, 2022

(65) Prior Publication Data

US 2023/0127496 A1 Apr. 27, 2023

Related U.S. Application Data

(63) Continuation of application No. PCT/KR2022/016493, filed on Oct. 26, 2022.

(30) Foreign Application Priority Data

Oct. 26, 2021 (KR) .......................... 10-2021-0143728

(51) Int. Cl.
*H05K 5/00* (2006.01)
*H04B 1/3818* (2015.01)
*H05K 5/02* (2006.01)

(52) U.S. Cl.
CPC ......... *H05K 5/0286* (2013.01); *H04B 1/3818* (2015.01)

(58) Field of Classification Search
CPC ........................... H05K 5/0017; H05K 5/0217
(Continued)

(56) References Cited

U.S. PATENT DOCUMENTS

2012/0252240 A1 10/2012 Yang
2012/0276780 A1 11/2012 Hu et al.
(Continued)

FOREIGN PATENT DOCUMENTS

KR          20120109816 A    10/2012
KR          10-1554128 B1     9/2015
(Continued)

OTHER PUBLICATIONS

International Search Report for PCT/KR2022/016493 dated Feb. 2, 2023.
(Continued)

*Primary Examiner* — Hung S. Bui
(74) *Attorney, Agent, or Firm* — CANTOR COLBURN LLP

(57) ABSTRACT

An electronic device includes a circuit board, a socket on the circuit board and electrically connected to the circuit board, and a tray removably insertable into the socket from outside the electronic device, the tray including a body portion, a first protrusion extended from the body portion, and a second protrusion extended from the body and spaced apart from the first protrusion. The socket includes a detection portion which is engageable with the first protrusion of the tray and detects insertion of the tray in the socket, together with the circuit board, and a supporting portion which is engageable with the second protrusion of the tray. The tray which is inserted into the socket disposes the first protrusion contacting the detection portion, and a portion of the tray corresponding to the second protrusion supported by the supporting portion.

20 Claims, 17 Drawing Sheets

(58) Field of Classification Search
USPC .......................................... 361/807, 809, 810
See application file for complete search history.

(56) References Cited

U.S. PATENT DOCUMENTS

| | | | |
|---|---|---|---|
| 2016/0036143 | A1 | 2/2016 | Motohashi et al. |
| 2016/0248184 | A1* | 8/2016 | Motohashi ............... G06K 7/00 |
| 2016/0334839 | A1 | 11/2016 | Hyeon et al. |
| 2016/0359269 | A1* | 12/2016 | Motohashi ......... G06K 13/0831 |
| 2016/0360631 | A1* | 12/2016 | Tan ........................ H01R 13/46 |
| 2017/0170584 | A1 | 6/2017 | Yang |
| 2017/0172004 | A1 | 6/2017 | Yang et al. |
| 2017/0214178 | A1* | 7/2017 | Motohashi ........... H01R 12/714 |
| 2018/0069330 | A1 | 3/2018 | Cheng |
| 2018/0110143 | A1* | 4/2018 | Zhao ..................... G06F 1/1626 |
| 2018/0321711 | A1 | 11/2018 | Choi et al. |
| 2019/0013831 | A1 | 1/2019 | Zuo |
| 2019/0341953 | A1 | 11/2019 | Cha |
| 2020/0076130 | A1 | 3/2020 | Zhao et al. |
| 2020/0293841 | A1 | 9/2020 | Yang et al. |

FOREIGN PATENT DOCUMENTS

| | | |
|---|---|---|
| KR | 101875903 B1 | 8/2018 |
| KR | 102120399 B1 | 6/2020 |

OTHER PUBLICATIONS

European Search Report for European Patent Application No. 22887618.1 dated Nov. 22, 2024.

* cited by examiner

TRAY SUPPORT STRUCTURE AND ELECTRONIC DEVICE INCLUDING THE SAME

CROSS REFERENCE TO RELATED APPLICATIONS

This application is a PCT-Bypass Continuation of International Patent Application No. PCT/KR2022/016493, filed on Oct. 26, 2022, which claims priority to Korean Patent Application No. 10-2021-0143728, filed on Oct. 26, 2021, and all the benefits accruing therefore under 35 U.S.C. § 119, the contents of which are hereby incorporated by reference for all purposes as if fully set forth herein.

TECHNICAL FIELD

Various embodiments of the disclosure relate to a tray and/or an electronic device including the same. More particularly, embodiments of the disclosure related to a tray removably disposed in a housing of an electronic device and/or an electronic device including the same.

BACKGROUND ART

The growth of electronics, information, and communication technologies leads to integration of various functions into a single electronic device. For example, smartphones pack the functionalities of a sound player, imaging device and scheduler, as well as the communication functionality. Further to these functionalities, the single electronic device like a smartphone may implement more various functions by having applications installed thereon for executing the various functions. An electronic device may not only access the applications or stored files stored thereon, but may also access, wiredly or wirelessly, a server or an electronic device external to the electronic device, to receive, in real-time, various pieces of information.

As various functions may be integrated into one electronic device, and as electronic devices are downsized, electronic devices may be used during transport thereof, such as by a user. In such a trend, manufacturers and/or providers of electronic devices are competing to develop electronic devices that are more compact in overall size but provide higher performance and functionality.

DISCLOSURE

Technical Problem

A portable electronic device may include a storage medium, such as a user authentication module card or a memory card. Such a storage medium may be built into the electronic device itself, or configured to be easily replaced and/or added to the electronic device, such as by the user. For example, the electronic device may include a tray removably disposed in the housing. The storage medium may be placed on the tray and mounted in the electronic device and/or housing, such that the storage medium is removably disposed relative to the housing, via the tray.

To detect whether a mechanical structure, such as a tray, is mounted, the electronic device is equipped with a separate mounting/demounting detection member. If the tray is in for a long time and its loads continuously act on the mounting/demounting detection member, the mounting/demounting detection member may be deformed or broken.

An embodiment of the disclosure may provide an electronic device including a structure that distributes the loads applied from the tray in the electronic device, to internal components of the electronic device by the tray resting for a long time within the electronic device.

Technical Solution

According to an embodiment of the disclosure, there may be provided an electronic device including a circuit board, a socket disposed on the circuit board, and a tray insertable into the socket, where the socket includes a detection portion for detecting insertion of the tray and a supporting portion for supporting at least a portion of the tray, and where the tray includes a body portion, a first protrusion extended from the body portion to contact the detection portion, and a second protrusion extended from the body portion to be supported by the supporting portion.

According to an embodiment of the disclosure, there may be provided a tray-socket combined structure including a socket configured to be mounted in an electronic device, and a tray configured to be inserted into the socket, where the socket includes a lower supporting member including a supporting portion in at least a portion thereof, a detection portion disposed on the lower supporting member, and an upper cover disposed on the lower supporting member to provide a tray insertion opening, and where the tray includes a body portion, a first protrusion formed to extend from the body portion to contact the detection portion, and a second protrusion formed to extend from the body portion, and where the supporting portion is formed to protrude from a portion of the lower supporting member.

Advantageous Effects

According to an embodiment of the disclosure, as the loads of the tray removably mounted in the electronic device are distributed, deformation or damage to internal components of the electronic device, by the loads, may be reduced or effectively prevented.

DESCRIPTION OF THE DRAWINGS

FIG. 16(*b*) is an enlarged plan view of portion G of FIG. 16(*a*);

DETAILED DESCRIPTION

Figure 1:
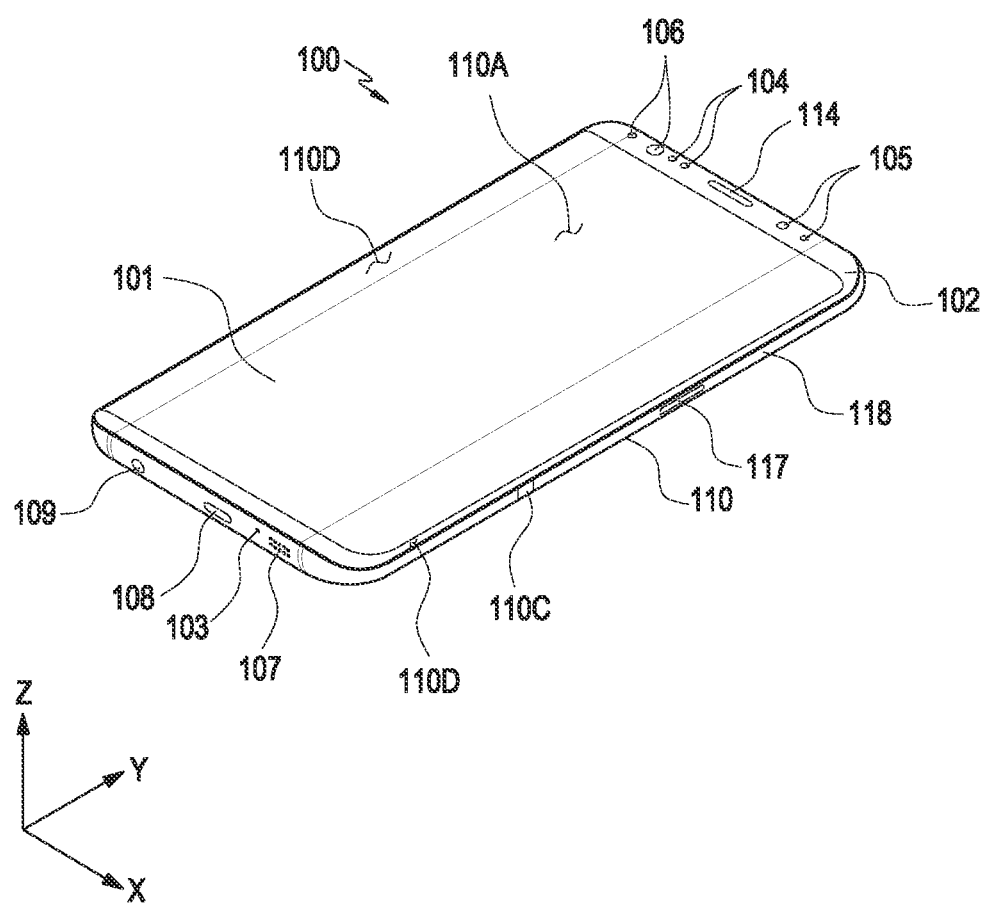
FIG. 1 is a front perspective view illustrating an electronic device according to an embodiment.

The electronic device according to an embodiment may be one of various types of devices. The electronic devices may include, for example, a portable communication device (e.g., a smart phone), a computer device, a portable multimedia device, a portable medical device, a camera, a wearable device, or a home appliance. According to an embodiment of the present invention, the electronic device is not limited to the above-listed embodiments.

It should be appreciated that an embodiment of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements.

It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases.

As used herein, such terms as "1st" and "2nd," or "first" and "second" may be used to simply distinguish a corresponding component from another, and does not limit the components in other aspect (e.g., importance or order).

It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

An embodiment as set forth herein may be implemented as software (e.g., the program) including one or more instructions that are stored in a storage medium (e.g., internal memory or external memory) that is readable by a machine (e.g., the electronic device). For example, a processor of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to an embodiment of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to an embodiment, each component (e.g., a module or a program) of the above-described components may include a single entity or multiple entities. Some of the plurality of entities may be separately disposed in different components. According to an embodiment, one or more of the above-described components may be omitted, or one or more other components may be added. Alternatively or additionally, a plurality of components (e.g., modules or programs) may be integrated into a single component. In such a case, according to an embodiment, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
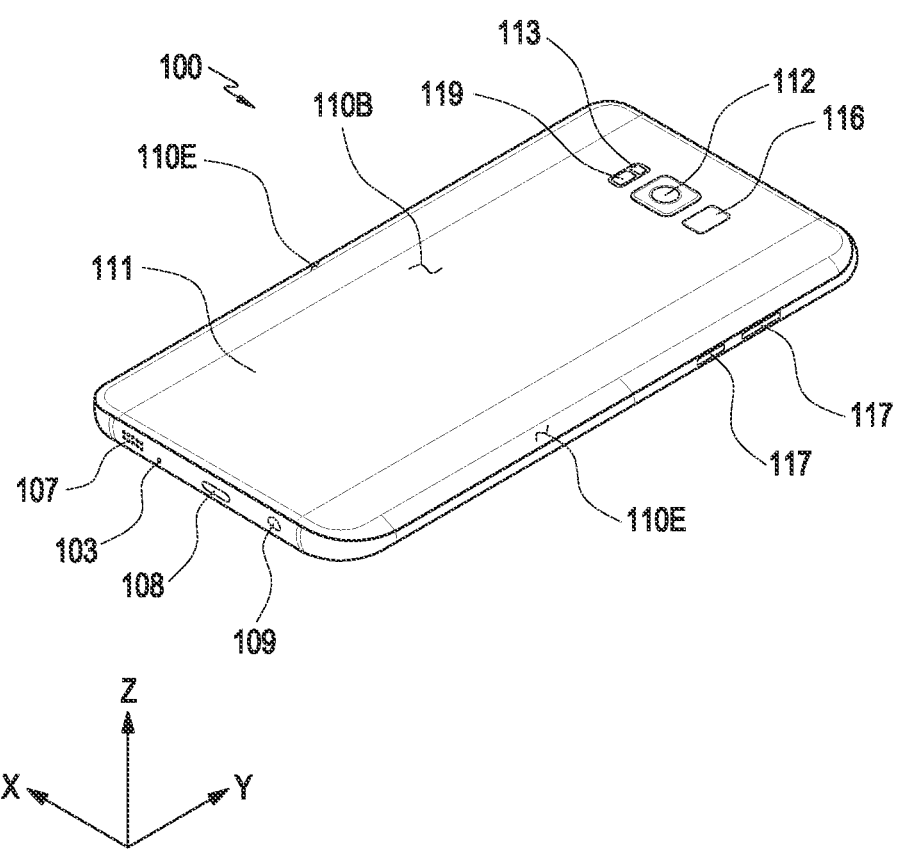
FIG. 2 is a rear perspective view illustrating the electronic device of FIG. 1.

Referring to FIGS. 1 and 2, according to an embodiment, an electronic device 100 may include a housing 110 with a first (or front) surface 110A, a second (or rear) surface 110B, and a side surface 110C surrounding a space between the first surface 110A and the second surface 110B. The electronic device 100 may be disposed in a plane defined by an x-axis direction and a y-axis direction crossing each other. A thickness direction of the electronic device 100 and various components and/or layers thereof may be defined along the z-axis direction. A plan view may be a view along the z-axis direction, of the plane defined by the two directions (e.g., the x-axis direction and the y-axis direction crossing each other).

According to an embodiment (not shown), the housing may denote a structure forming part of the first surface 110A, the second surface 110B, and the side surface 110C of FIG. 1. According to an embodiment, at least part of the first surface 110A may have a substantially transparent front plate 102 (e.g., a glass plate or polymer plate including various coat layers). The second surface 110B may be formed by a rear plate 111 that is substantially opaque. The rear plate 111 may be formed of, e.g., laminated or colored glass, ceramic, polymer, metal (e.g., aluminum, stainless steel (STS), or magnesium), or a combination of at least two thereof. The side surface 110C may be formed by a bezel structure (or a "side structure") 118 that couples to the front plate 102 and the rear plate 111 and includes a metal and/or polymer. According to an embodiment, the rear plate 111 and the side structure 118 may be integrally formed together and include the same material (e.g., a metal, such as aluminum).

In the illustrated embodiment, the front plate 102 may include two first areas 110D, which are bent, and seamlessly extend, from the first surface 110A toward the rear plate 111, at two opposite long edge ends of the front plate 102. In the illustrated embodiment (see FIG. 2), the rear plate 111 has two second areas 110E, which are bent, and seamlessly extend, from the second surface 110B toward the front plate 102, at two opposite long edge ends. According to an embodiment, the front plate 102 (or the rear plate 111) may include only one of the first areas 110D (or the second areas 110E). In an embodiment, some of the first areas 110D or the second areas 110E may not be included. In the above embodiments, when viewed from a side of the electronic device 100, the side structure 118 may have a first thickness (or width) at a side surface which does not include the first areas 110D or the second areas 110E and a second thickness, smaller than the first thickness, at a side surface which includes the first areas 110D or the second areas 110E.

According to an embodiment, the electronic device 100 may include at least one or more of a display 101, audio modules 103, 107, and 114, sensor modules 104, 116, and 119, camera modules 105, 112, and 113, key input devices 117, a light emitting device 106, and connector holes 108 and 109. According to an embodiment, the electronic device 100 may exclude at least one (e.g., the key input device 117 or the light emitting device 106) of the components or may add other components.

According to an embodiment, the display 101 may be visually revealed through, e.g., a majority portion of the front plate 102. In some embodiments, at least a portion of the display 101 may be visually exposed through the front plate 102 forming the first surface 110A and the first areas 110D of the side surface 110C. According to an embodiment, the edge of the display 101 may be formed to be substantially the same in shape as an adjacent outer edge of the front plate 102. According to an embodiment (not shown), the interval between the outer edge of the display 101 and the outer edge of the front plate 102 may remain substantially even to give a larger area of exposure the display 101.

According to an embodiment (not shown), the screen display area of the display 101 may have a recess or opening in a portion thereof, and at least one or more of the audio module 114, sensor module 104, camera module 105, and light emitting device 106 may be aligned with the recess or opening. According to an embodiment (not shown), at least one or more of the audio module 114, sensor module 104, camera module 105, fingerprint sensor 116, and light emitting device 106 may be included on the rear surface of the screen display area of the display 101.

In an embodiment (not shown), the display 101 may include at least one of an audio module 114, a sensor module 104, a camera module 105, and a light emitting device 106 on the rear surface of the screen display area (e.g., the first surface 110A and the first areas 110D). For example, the electronic device 100 may have the camera module 105 disposed on the rear surface of at least one of the first surface 110A (e.g., the front surface) and/or the side surface 110C (e.g., the first area 110D) to face the first surface 110A and/or the side surface 110C. For example, the camera module 105 may include an under display camera (UDC) that is not exposed to the screen display area.

According to an embodiment (not shown), the display 101 may be disposed to be coupled with, or adjacent, a touch detecting circuit, a pressure sensor capable of measuring the strength (pressure) of touches, and/or a digitizer for detecting a magnetic field-type stylus pen. In some embodiments, at least a portion of the sensor modules 104 and 119, and/or at least a portion of the key input device 117 may be disposed in the first areas 110D and/or the second areas 110E.

In an embodiment (not shown), the display 101 may include a display that is disposed to be slidable and provides a screen (e.g., a screen display area). For example, the screen display area of the electronic device 100 is an area that is visually exposed and enables an image to be output. The electronic device 100 may adjust the screen display area according to movement of a sliding plate (not shown) or movement of the display 101. For example, the electronic device 100 may include a rollable electronic device configured to selectively expand the screen display area as at least a portion (e.g., the housing) of the electronic device 100 is operated to be at least partially slidable. For example, the display 101 may be referred to as a slide-out display or an expandable display.

According to an embodiment, the audio modules 103, 107, and 114 may include a microphone hole 103 and speaker holes 107 and 114. A microphone for acquiring external sounds may be disposed in the microphone hole 103. In some embodiments, a plurality of microphones may be disposed to detect the direction of the sound. The speaker holes 107 and 114 may include an external speaker hole 107 and a phone receiver hole 114. According to an embodiment, the speaker holes 107 and 114 and the microphone hole 103 may be implemented as a single hole, or speakers may be rested without the speaker holes 107 and 114 (e.g., piezo speakers).

According to an embodiment, the sensor modules 104, 116, and 119 may generate an electrical signal or data value corresponding to an internal operating state or external environmental state of the electronic device 100. For example, the sensor modules 104, 116, and 119 may include a first sensor module 104 (e.g., a proximity sensor) and/or a second sensor module (not shown) (e.g., a fingerprint sensor), which is disposed on the first surface 110A of the housing 110, and/or a third sensor module 119 (e.g., a heartrate monitor (HRM) sensor) and/or a fourth sensor module 116 (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may include a sensor module not shown, e.g., at least one of a gesture sensor, a gyro sensor, a barometric sensor, a magnetic sensor, an acceleration sensor, a grip sensor, a color sensor, an infrared (IR) sensor, a biometric sensor, a temperature sensor, a humidity sensor, or an illuminance sensor.

According to an embodiment, the camera modules 105, 112, and 113 may include a first camera device 105 disposed on the first surface 110A of the electronic device 100, and a second camera device 112 and/or a flash 113 disposed on the second surface 110B. The camera devices 105 and 112 may include one or more lenses, an image sensor, and/or an image signal processor. The flash 113 may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 100.

According to an embodiment, the key input device 117 may be disposed on the side surface 110C of the housing 110. According to an embodiment, the electronic device 100 may exclude all or some of the above-mentioned key input devices 117 and the excluded key input devices 117 may be implemented in other forms, e.g., as soft keys, on the display 101. According to an embodiment, the key input device may include the sensor module 116 disposed on the second surface 110B of the housing 110.

According to an embodiment, the light emitting device 106 may be disposed on the first surface 110A of the housing 110, for example. The light emitting device 106 may provide, e.g., information about the state of the electronic device 100 in the form of light. According to an embodiment, the light emitting device 106 may provide a light source that interacts with, e.g., the camera module 105. The light emitting device 106 may include, e.g., a light emitting diode (LED), an infrared (IR) LED, or a xenon lamp.

According to an embodiment, the connector holes 108 and 109 may include, e.g., a first connector hole 108 for receiving a connector (e.g., a universal serial bus (USB) connector) for transmitting or receiving power and/or data to/from an external electronic device and/or a second connector hole (e.g., an earphone jack) 109 for receiving a connector for transmitting or receiving audio signals to/from the external electronic device.

Figure 3:
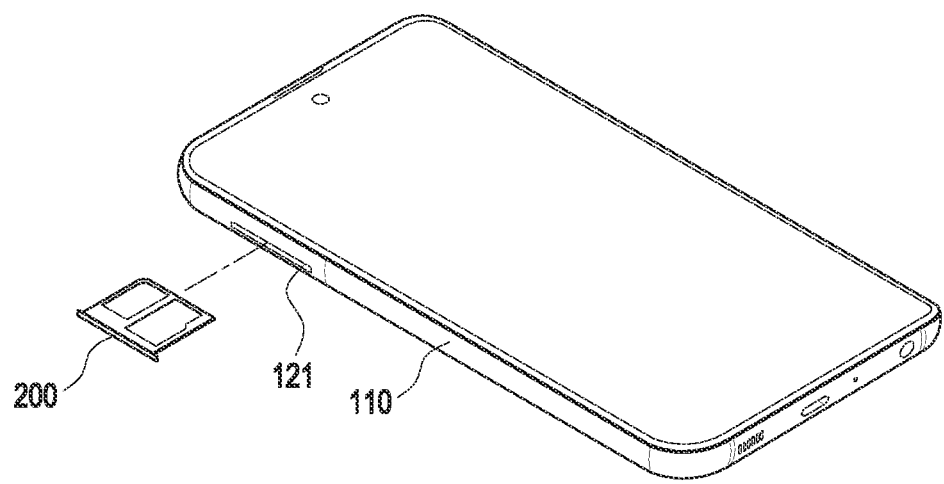
FIG. 3 is a view illustrating an implementation example of an electronic device according to an embodiment.
Figure 4:
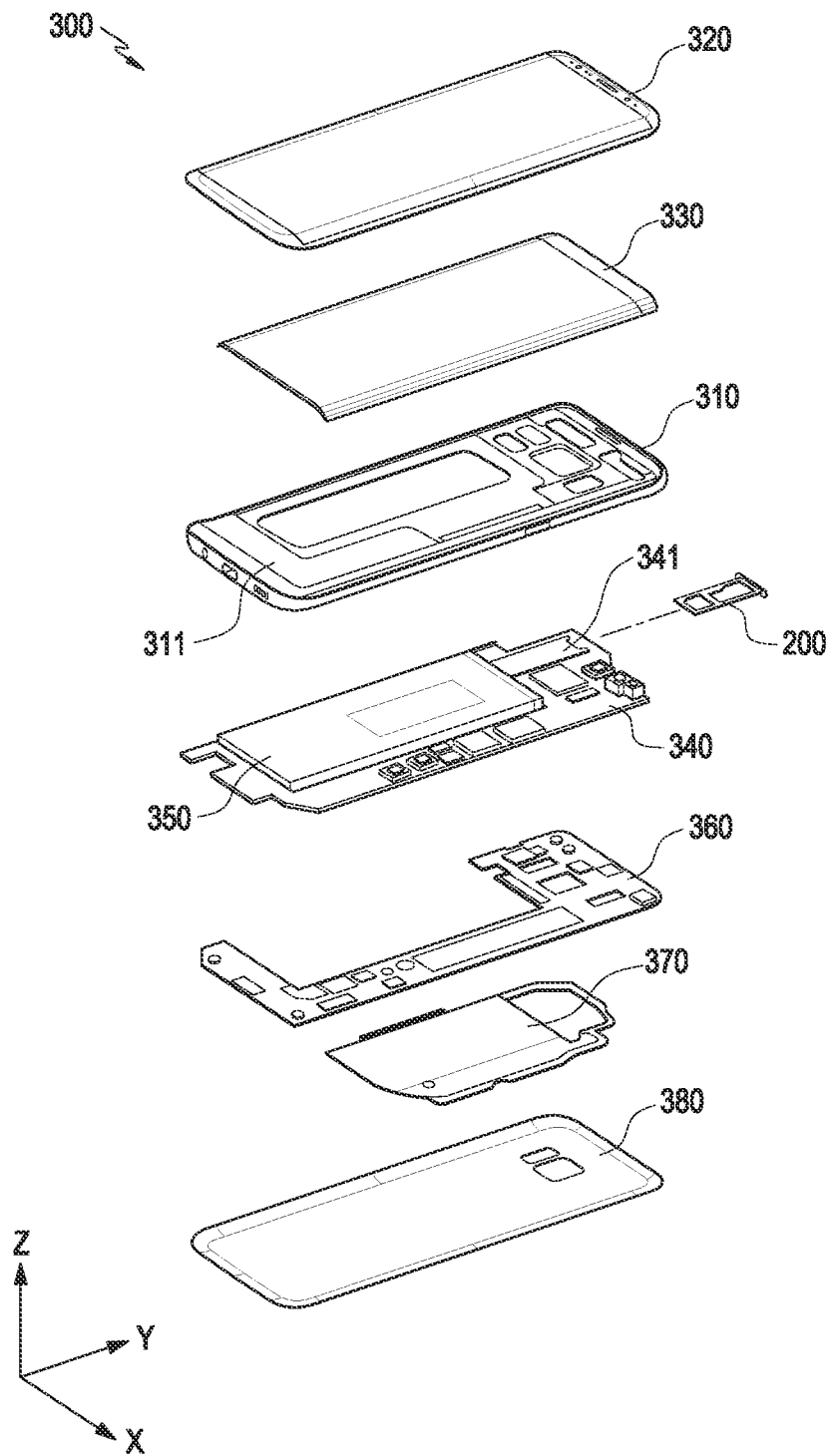
FIG. 4 is an exploded perspective view illustrating an electronic device according to an embodiment.

FIG. 3 is a view illustrating an implementation example of an electronic device according to an embodiment. FIG. 4 is an exploded perspective view illustrating an electronic device according to an embodiment.

Referring to FIGS. 3 and 4, an electronic device 100 may include a housing 110 and a tray 200. According to an embodiment, the tray 200 may be inserted through a tray insertion opening 121 formed in the housing 110.

According to an embodiment, an electronic device 300 may include a side structure 310, a first supporting member 311 (e.g., a bracket), a front plate 320, a display 330, a printed circuit board 340 (e.g., a printed circuit board (PCB), a printed board assembly (PBA), a flexible PCB (FPCB), or a rigid-flexible PCB (RFPCB)), a battery 350, a second supporting member 360 (e.g., a rear case), an antenna 370, and a rear plate 380. According to an embodiment, the electronic device 300 may exclude at least one (e.g., the first supporting member 311 or the second supporting member 360) of the components or may add other components. According to an embodiment (not shown), the electronic device 300 may include at least one hinge structure to thereby have a structure in which a housing split into a plurality of areas is folded. For example, according to a change in the state of the hinge structure (e.g., a folded state, an intermediate state, or an unfolded state), the state of the display operatively connected to the housing may change. For example, the first display corresponding to the first housing and the second display corresponding to the second housing may be changed to face each other or to be spaced apart from each other. According to an embodiment, at least one of the components of the electronic device 300 may be the same or similar to at least one of the components of the electronic device 100 of FIG. 1 or 2 and no duplicate description is made below.

According to an embodiment, the first supporting member 311 may be disposed inside the electronic device 300 to be connected with the side structure 310 or integrated with the side structure 310. The first supporting member 311 may be formed of, e.g., a metallic material and/or non-metallic material (e.g., polymer). The display 330 may be joined onto one surface of the first supporting member 311, and the printed circuit board 340 may be joined onto the opposite surface of the first supporting member 311.

According to an embodiment, a processor, a memory, and/or an interface may be mounted on the printed circuit board 340. The processor may include one or more of, e.g., a central processing unit, an application processor, a graphic processing device, an image signal processing, a sensor hub processor, or a communication processor. In one embodiment, the processor or communication module may be mounted in the electronic component, such as an integrated circuit chip, and disposed on the printed circuit board 340.

According to an embodiment, the memory may include, e.g., a volatile or non-volatile memory.

According to an embodiment, the interface may include, e.g., a high definition multimedia interface (HDMI), a universal serial bus (USB) interface, a secure digital (SD) card interface, and/or an audio interface. The interface may electrically or physically connect, e.g., the electronic device 300 with an external electronic device and may include a USB connector, an SD card/multimedia card (MMC) connector, or an audio connector.

According to an embodiment, the battery 350 may be a device for supplying power to at least one component of the electronic device 300. The battery 189 may include, e.g., a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 300.

According to an embodiment, the antenna 370 may be disposed between the rear plate 380 and the battery 350. The antenna 370 may include, e.g., a near-field communication (NFC) antenna, a wireless charging antenna, and/or a magnetic secure transmission (MST) antenna. The antenna 370 may perform short-range communication with, e.g., an external device or may wirelessly transmit or receive power necessary for charging. According to an embodiment of the present invention, an antenna structure may be formed by a portion or combination of the side structure 310 and/or the first supporting member 311.

According to an embodiment, the electronic device 300 (e.g., the electronic device 100 of FIGS. 1 and 2) may include the tray 200 and/or the socket 341, so that the user may replace or add a storage medium, such as a user identification module card or a memory card, as necessary. The tray 200 provides a space and/or structure capable of receiving at least one storage medium and may be removably received in the housing 110. For example, the tray 200 may be inserted into the housing 110 through the tray insertion opening 121. The tray insertion opening 121 may expose an internal area of the housing 110 to outside the electronic device 300, such that the tray 120 is removably disposable in the housing 110 via the tray insertion opening 121. In an embodiment, the socket 341 may be disposed inside the housing 110 to receive and/or secure at least a portion of the tray 200 within the housing. In an embodiment, the socket 341 may be mounted on the printed circuit board 340 to be electrically connected to at least some of the electrical/electronic components disposed on the printed circuit board 340. For example, the storage medium disposed on the tray 200 may be electrically connected to the socket 341 and/or to the printed circuit board 340, through the socket 341.

The configuration of the electronic device 300 of FIGS. 3 and 4 may be identical or similar in whole or part to the configuration of the electronic device 100 of FIGS. 1 and 2, and no duplicate description thereof is thus given.

According to an embodiment, the electronic device 100 may include a load distribution structure. According to an embodiment, the load distribution structure may be provided in a coupling relationship between the tray 200 and the socket 341 and, to that end, the tray 200 and the socket 341 respectively may further include separate components.

In the following description of the disclosure, a load distribution structure provided to the electronic device 100 according to an embodiment is described with reference to the drawings. First, with reference to FIGS. 5 to 8, a structure of the socket 500 according to an embodiment is described.

Figure 5:
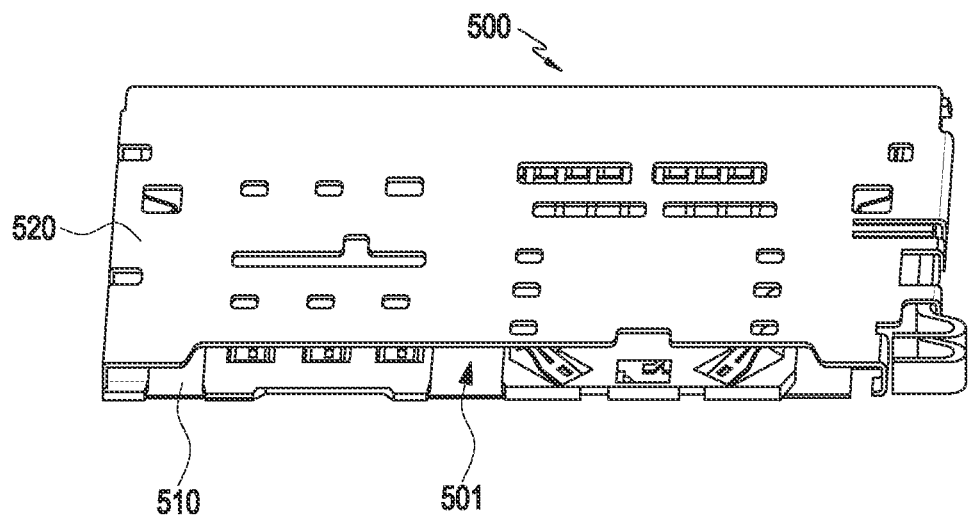
FIG. 5 is a perspective view illustrating a socket according to an embodiment.
Figure 6:
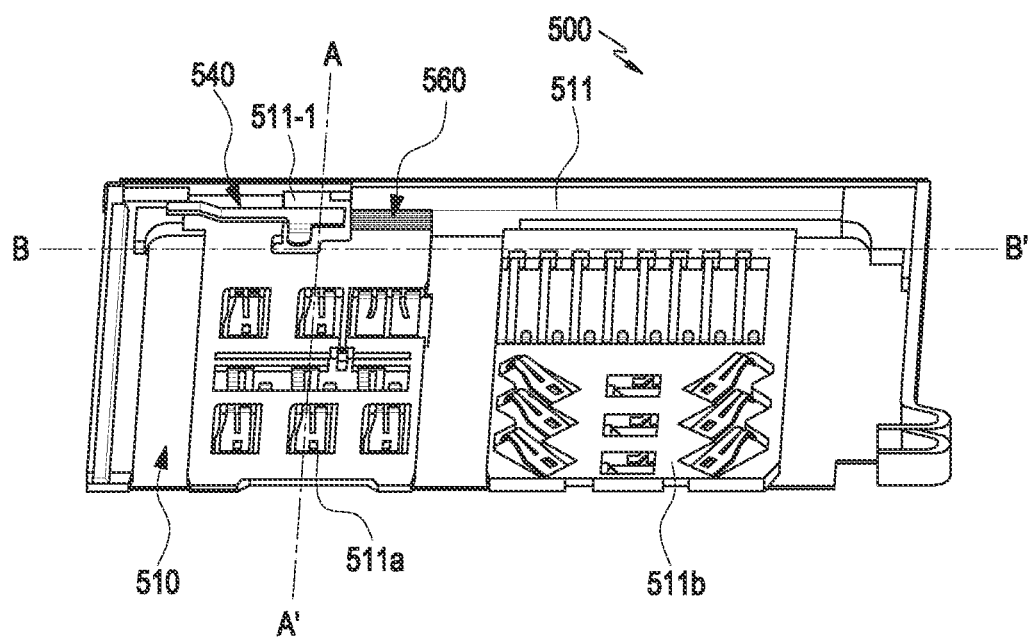
FIG. 6 is a view illustrating an internal configuration of a socket according to an embodiment.

FIG. 5 is a perspective view illustrating a socket according to an embodiment. FIG. 6 is a view illustrating an internal configuration of a socket according to an embodiment. Referring to FIGS. 5 and 6, the socket 500 may include a lower supporting member 510 and an upper cover 520. The description of the configuration of the socket 341 of FIG. 4 may be applied to the configuration of the socket 500 of FIGS. 5 and 6.

According to an embodiment, the upper cover 520 may be disposed on an upper portion of the lower supporting member 510. According to an embodiment, the lower supporting member 510 and the upper cover 520 may be combined to provide a tray insertion area 501 for insertion of a tray 200 (refer to FIGS. 3 and 4). For example, the tray insertion area 501 may be provided as an opening in one side of the socket 500. The tray insertion area 501 may be open to outside the socket 500 in a direction. The tray insertion area 501 may correspond to the tray insertion opening 121, without being limited thereto.

According to an embodiment, the lower supporting member 510 may include one or more circuit areas 511a and 511b. According to an embodiment, the circuit areas 511a and 511b may be electrically connected to the printed circuit board 340 (refer to FIG. 4). Further, the circuit areas 511a and 511b may be electrically connected to one or more storage media receivable in the tray 200 (refer to FIG. 3). For example, if the tray 200 (refer to FIG. 3) is inserted into the socket 500 while receiving one or more storage media, the circuit areas 511a and 511b may electrically mediate between the storage media and the printed circuit board 340 (refer to FIG. 4). According to an embodiment, the lower supporting member 510 may include a plurality of circuit areas 511a and 511b and may be electrically connected to the plurality of storage media or may include only a single circuit area 511a or 511b. Further, although not shown in the drawings, the lower supporting member 510 may include three or more circuit areas.

According to an embodiment, the lower supporting member 510 may include a detection portion 540 which provides a function of detecting insertion/removal of the tray (e.g., the tray 200 of FIG. 4) relative to the socket and/or the electronic device. In an embodiment, the detection portion 540 is engageable with a first protrusion of the tray and detects insertion of the tray in the socket, together with the circuit board connected to the socket. According to an embodiment, the detection portion 540 may be disposed around the edge area 511 of the lower supporting member 510. For example, the edge area 511 may include a detection portion receiving area 511-1 on one side, and the detection portion 540 may be disposed in the detection portion receiving area 511-1. The edge area 511 of the lower supporting member 510 may be positioned on the side opposite to the tray insertion area 501 (refer to FIG. 5). According to an embodiment, the detection portion 540 may be electrically connected to a printed circuit board (e.g., the printed circuit board 340 of FIG. 4).

According to an embodiment, the lower supporting member 510 may include a supporting portion 560 for reducing deformation of the detection portion 540. As is described below, the supporting portion 560 may support at least a portion of the tray (e.g., the tray 200 of FIG. 4). According to an embodiment, the supporting portion 560 may be arranged side by side with the detection portion 540. For example, the supporting portion 560 may mean a portion of the edge area 511 of the lower supporting member 510 adjacent to the detection portion 540. In an embodiment, the socket 500 defines a tray insertion opening 121 through which the tray 200 is insertable from outside the electronic device, and the supporting portion 560 of the socket 500 is in an edge area 511 of the socket 500 which is furthest from the tray insertion opening 121. According to an embodiment, the edge area 511 of the lower supporting member 510 may be formed of a barrier rib. For example, the edge area 511 may be formed of a barrier rib protruding from one side of the lower supporting member 510, and the supporting portion 560 may mean a portion of the barrier rib.

Figure 7:
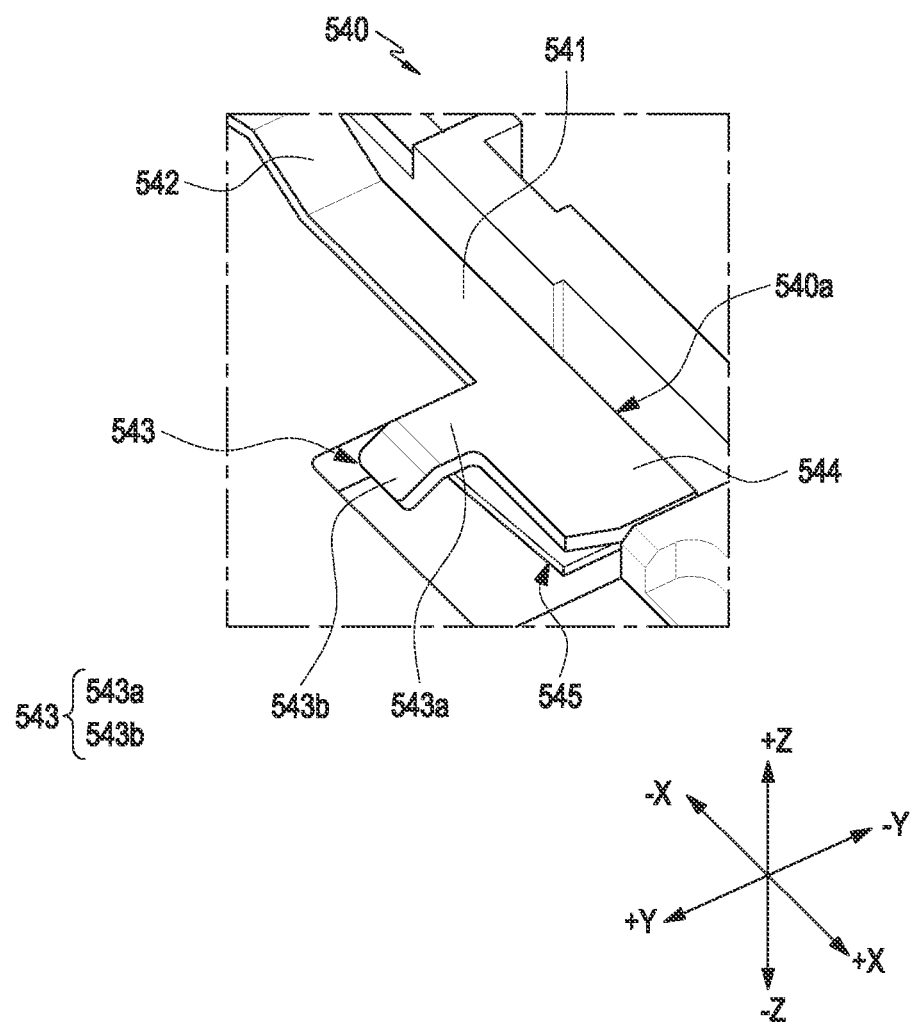
FIG. 7 is an enlarged perspective view illustrating a detection portion according to an embodiment.
Figure 8:
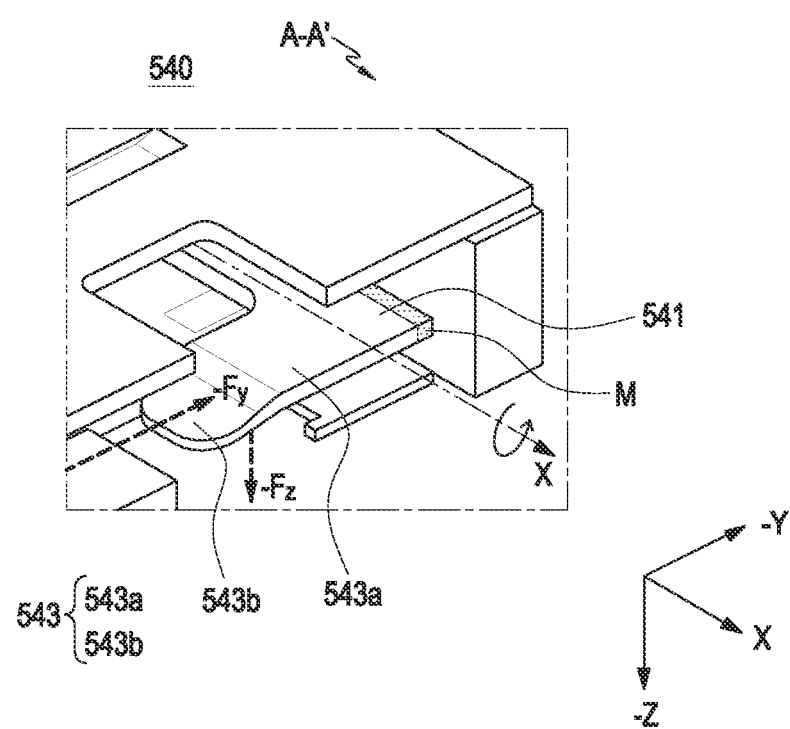
FIG. 8 is a cross-sectional view taken along A-A' of FIG. 6.
Figure 9A:
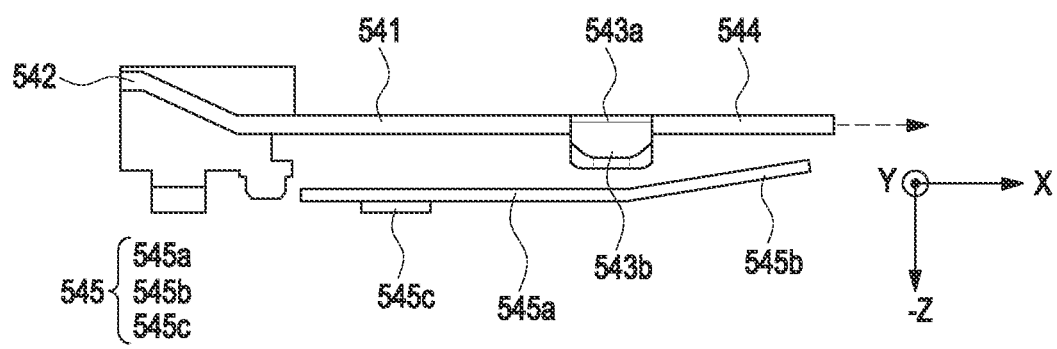
FIGS. 9(a) and 9(b) is a view illustrating an operation of a detection lever according to an operation of a tray contact area.
Figure 9B:
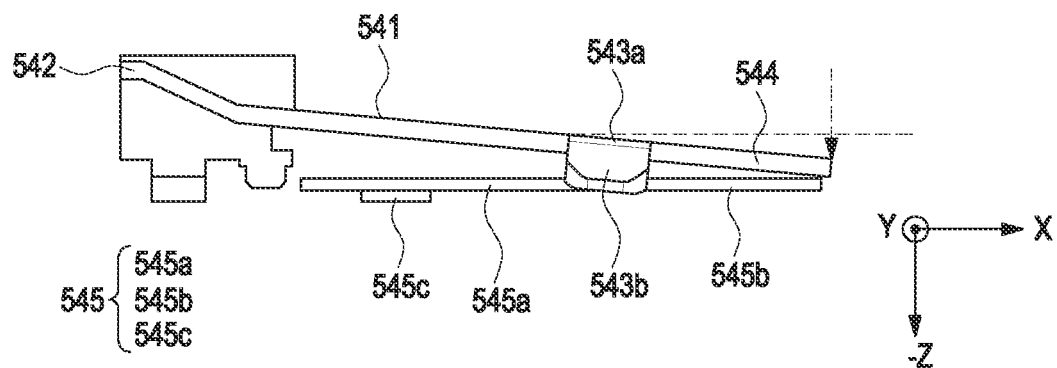
Figure 10:
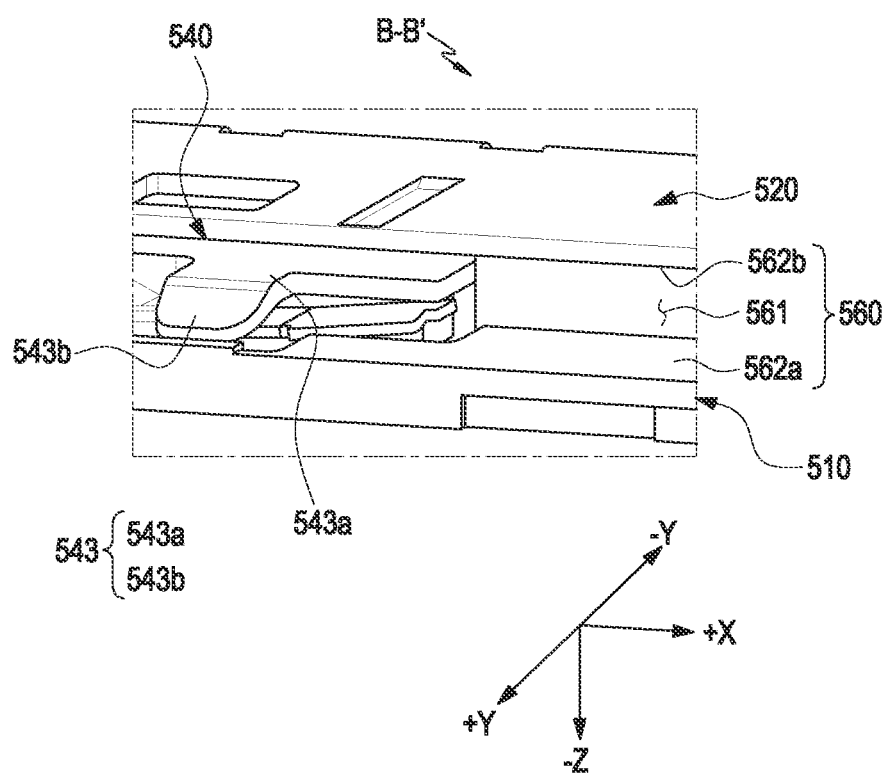
FIG. 10 is a cross-sectional view taken along B-B' of FIG. 6.

FIG. 7 is an enlarged view illustrating a detection portion according to an embodiment. FIG. 8 is a cross-sectional view taken along A-A' of FIG. 6, illustrating the operation of the tray contact area. FIGS. 9(*a*) and 9(*b*) are views illustrating an operation of a detection lever according to an operation of a tray contact area. FIG. 10 is a cross-sectional view taken along B-B' of FIG. 6.

FIG. 7 illustrates a detection portion 540 according to an embodiment. Referring to FIG. 7, the detection portion 540 may include a lever member 540*a* and a detection member 545. According to an embodiment, the lever member 540*a* may include a connection area 542 connected with at least a portion of the lower supporting member 510 (refer to FIG. 6), on a first side (the side in the −x-axis direction) of the length area 541. For example, the connection area 542 may be formed to extend from the length area 541 in the −x-axis direction. According to an embodiment, the connection area 542 may be formed to form a predetermined angle with the length area 541. A detection area 544 may be formed on a second side (e.g., the side opposite to the first side, in the +x-axis direction) of the length area 541. The detection area 544 may come into contact with the detection member 545 when an external force is applied (e.g., when the tray 200 of FIG. 4 is inserted into the socket 500). Elements which are in contact with each other, may form an interface therebetween, without being limited thereto.

According to an embodiment, the lever member 540*a* may include a tray contact area 543. The tray contact area 543 may be formed to extend from the length area 541 in a direction (+y-axis direction) different from the direction in which the connection area 542 or the detection area 544 extends. For example, the +y-axis direction may correspond to the direction (−y-axis direction) in which the tray (e.g., the tray 200 of FIG. 4) is inserted. According to an embodiment, the tray contact area 543 may include an extension area 543*a* and a slide area 543*b*. For example, the extension area 543*a* may be formed to extend from the length area 541, and the slide area 543*b* may be formed to extend from the extension area 543*a* and be bent from the extension area 543*a*. For example, the slide area 543*b* may be formed to have a predetermined angle form the extension area 543*a*, so that a first protrusion (e.g., the first protrusion 610 of FIGS. 11(*a*) and 11(*b*)) may slide on the slide area 543*b*. According to an embodiment, the tray contact area 543 may contact at least a portion (e.g., the first protrusion 610 of FIGS. 11(*a*) and 11(*b*)) of the tray (e.g., the tray 600 of FIGS. 11(*a*) and 11(*b*)) to induce an operation of the lever member 540*a*, as described below.

FIGS. 8, 9(*a*) and 9(*b*) illustrate the operation of the detection portion according to an embodiment. FIG. 8 is a cross-sectional view taken along A-A' of FIG. 6, illustrating the operation of the tray contact area. FIGS. 9(*a*) and 9(*b*) are views illustrating an overall operation of a detection lever.

Referring to FIGS. 8 and 9, when an external force is applied to the tray contact area 543, the detection lever 540*a* may operate. The description of the detection portion 540 of FIG. 7 may be applied to the detection portion 540 of FIGS. 8 and 9.

According to an embodiment, as the slide area 543*b* forms a predetermined angle with the extension area 543*a* and/or the length area 541, if a force in the first direction (e.g., the insertion direction (−y-axis direction) of the tray 200) (−Fy, hereinafter a 'first direction force') is applied to the slide area 543*b*, a force in the second direction (e.g., the −z-axis direction) (−Fz, hereinafter a 'second direction force') may act on the tray contact area 543. For example, a force may act on the tray contact area 543 in the direction perpendicular to the slide area 543*b*, and the force may be expressed as the sum of the first direction force −Fy and the second direction force −Fz.

According to an embodiment, the first direction force −Fy and/or the second direction force −Fz acting on the tray contact area 543 may induce rotation of the lever member 540*a* about a third direction (e.g., the x-axis direction). For example, in the edge area M of the length area 541 corresponding to the tray contact area 543, a first rotational moment (e.g., the rotational moment about the x-axis) may be generated by the first direction force −Fy and/or the second direction force −Fz acting on the tray contact area 543.

According to an embodiment (refer to (a) and (b) of FIG. 9), the first direction force −Fy (refer to FIG. 8) and/or the second direction force −Fz (refer to FIG. 8) acting on the tray contact area 543 may induce rotation (e.g., a second rotational moment) of the detection lever 540*a* about the first direction (e.g., the y-axis direction). For example, if the tray (e.g., the tray 600 of FIGS. 11(*a*) and 11(*b*)) is inserted into the socket 500, the lever member 540*a* may rotate about the y-axis with respect to the connection area 542. As the slide area 543*b* has an angle with the extension area 543*a* and the length area 541, at least a portion (e.g., the first protrusion 610 of FIGS. 11(*a*) and 11(*b*)) of the tray (e.g., the tray 600 of FIGS. 11(*a*) and 11(*b*)) may slide over the tray contact area 543 and may press the tray contact area 543. At least a portion (e.g., the first protrusion 610 of FIGS. 11(*a*) and 11(*b*)) of the tray (e.g., the tray 600 of FIGS. 11(*a*) and 11(*b*)) may smoothly rotate the lever member 540*a* about the first direction (y-axis direction). That is, the tray which is inserted into the socket engages the first protrusion with the tray contact area to press the tray contact area. Pressing of the tray contact area by the tray inserted into the socket applies a force in the first direction, to the to the detection portion of the socket, together with a pressing force in a second direction perpendicular to the first direction act, to the detection portion.

According to an embodiment, the detection member 545 may include a fixed area 545*a* and a pressing area 545*b*. According to an embodiment, the pressing area 545*b* may mean an edge area in the length direction (e.g., the x-axis direction) of the detection member 545. According to an embodiment, the pressing area 545*b* may extend from the fixed area 545*a* and may form a predetermined angle with the fixed area 545*a*. According to an embodiment, the detection member 545 may be formed of an elastic material. According to an embodiment, a transfer member 545*c* may be disposed under the fixed area 545*a*. Further, according to an embodiment, the detection lever 540*a* may be operated to contact the pressing area 545*b*. For example, due to the second direction force −Fz (refer to FIG. 8) applied to the tray contact area 543, the detection lever 540*a* may rotate about the first direction (y-axis direction) with respect to the connection area 542, and the detection area 544 may contact the pressing area 545*b*. The transfer member 545*c* may be electrically connected to a printed circuit board (e.g., the printed circuit board 340 of FIG. 4), and when the detection area 544 comes into contact with the pressing area 545*b*, the electronic device 100 (refer to FIG. 1) may detect insertion of the tray (e.g., the tray 200 of FIG. 4).

FIG. 10 is a cross-sectional view taken along B-B' of FIG. 6.

Figure 13A:
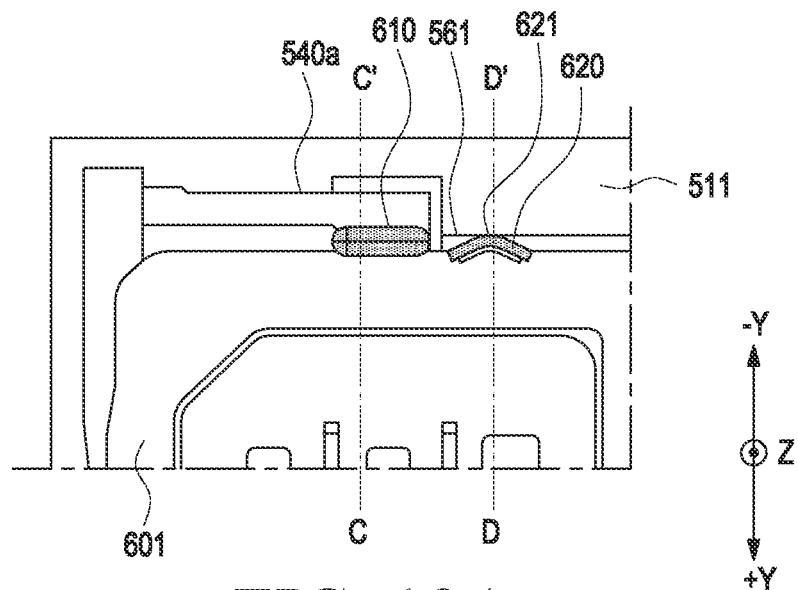
FIG. 13(*a*) is a plan view, and FIGS. 13(*b*) and 13(*c*) are enlarged views, illustrating the anti-breakage structure of FIG. 12.

Referring to FIG. 10, the lower supporting member 510 may include a supporting portion 560. According to an embodiment, the supporting portion 560 may receive at least a portion of the tray (e.g., the tray 600 of FIGS. 11(a) and 11(b)) (e.g., the second protrusion 620 of FIGS. 11(a) and 11(b)). Further, the supporting portion 560 may contact at least a portion (e.g., the contact surface 621 of FIG. 13(a)) of the tray (e.g., the tray 600 of FIGS. 11(a) and 11(b)), reducing an external force applied to the detection portion 540. According to an embodiment, the supporting portion 560 may be positioned in the edge area 511 (e.g., the edge area 511 of FIG. 6) of the lower supporting member 510 and be disposed in parallel with the detection portion 540. However, without limited thereto, the supporting portion 560 may be formed in other various positions where it is able to contact at least a portion of the tray (e.g., the tray 600 of FIGS. 11(a) and 11(b)). For example, the supporting portion 560 may be formed to correspond to the position of the second protrusion (e.g., the second protrusion 620 of FIGS. 11(a) and 11(b)) when the tray (e.g., the tray 600 of FIGS. 11(a) and 11(b)) is inserted in the socket 500.

The lower supporting member 510 of FIG. 10 is identical or similar in whole or part to the lower supporting member 510 of FIGS. 5 and 6, and no duplicate description thereof is given.

According to an embodiment, the supporting portion 560 may include a supporting area 561 (e.g., supporting surface), a first auxiliary area 562a, and a second auxiliary area 562b. According to an embodiment, the first auxiliary area 562a and the second auxiliary area 562b may be combined to provide a space for receiving at least a portion of the tray (e.g., the tray 600 of FIGS. 11(a) and 11(b)). According to an embodiment, the supporting area 561 may mean one surface of the supporting portion 560 perpendicular to the tray insertion direction (e.g., -y-axis direction). For example, the supporting area 561 may be a portion of a barrier rib (the barrier rib of the edge area 511, refer to FIG. 6) of the lower supporting member 510. Further, the first auxiliary area 562a may mean a portion of the upper surface of the lower supporting member 510 connected to the supporting area 561. The second auxiliary area 562b may mean a portion of the lower surface of the upper cover 520. According to an embodiment, the supporting area 561 may contact at least a partial area (e.g., the second protrusion 620 of FIGS. 11(a) and 11(b)) of the tray (e.g., the tray 600 of FIGS. 11(a) and 11(b)), supporting at least a partial area (e.g., the second protrusion 620 of FIGS. 11(a) and 11(b)) of the tray 600 in the first direction (e.g., the tray insertion direction (-y-axis direction)). Accordingly, displacement of the tray contact area 543 in the first direction (-y-axis direction) or the second direction (-z-axis direction) may be limited, or deformation of the tray contact area 543 may be reduced. In an embodiment, the tray 600 which is inserted into the socket 500 disposes the second protrusion 620 of the tray supported in the insertion direction, by the supporting surface. For example, the rotational displacement about the X axis (refer to FIG. 8) and/or the vertical displacement about the -Z axis of the tray contact area 543 may be limited. According to an embodiment, the supporting area 561 may guide the insertion position of the tray 600. For example, the tray 600 may be inserted in the socket 500 until the second protrusion 620 contacts the supporting area 561.

Figure 11A:
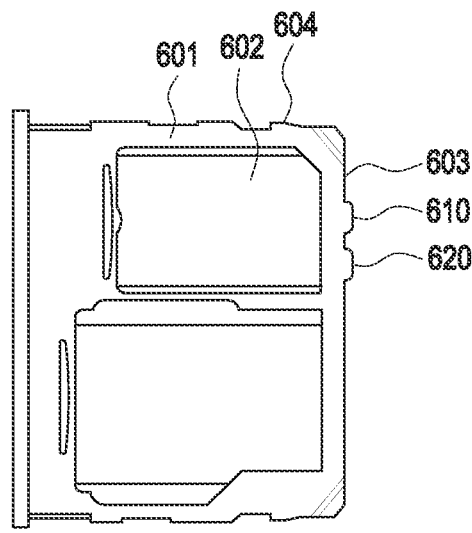
FIG. 11(a) is a plan view illustrating a tray according to an embodiment.
Figure 11B:
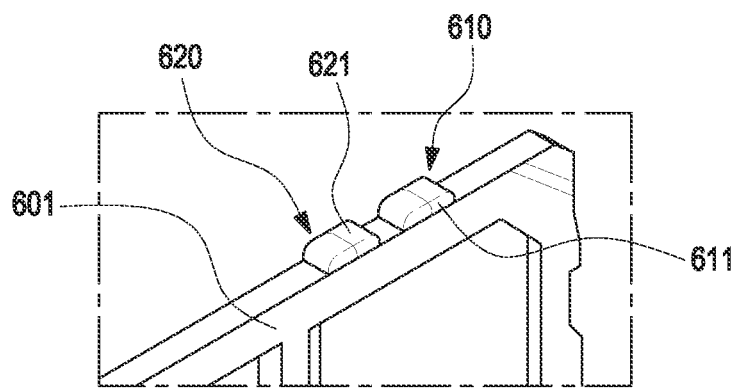
FIG. 11(*b*) is an enlarged perspective view of the tray in FIG. 11(*a*)

FIGS. 11(a) and 11(b) are a view illustrating a tray according to an embodiment.

Referring to FIGS. 11(a) and 11(b), the tray 600 may include a body portion 601, a first protrusion 610, and a second protrusion 620. The configuration of the tray 600 of FIG. 11 may be identical or similar in whole or part to the configuration of the tray 200 of FIGS. 3 and 4, and no duplicate description thereof is thus given.

According to an embodiment, the tray 600 may be insertable into a socket (e.g., the socket 500 of FIG. 5). For example, as described above, the tray 600 may be mounted in the socket 500 in a state in which the storage medium is received in the tray 600.

According to an embodiment, a receiving space 602 may be formed in the body portion 601. For example, the receiving space 602 may be an opening. The opening at the receiving space 602 may penetrate an entirety of the thickness of the tray 600, that is, the opening may be open at surfaces facing the lower supporting member 510 and the upper cover 520. According to an embodiment, a storage medium may be mounted in the receiving space 602. According to an embodiment, the first protrusion 610 and the second protrusion 620 may be formed on the first side surface 603 of the body portion 601. Further, the first protrusion 610 and the second protrusion 620 may be formed to extend from the first side surface 603 in the first direction. For example, the first side surface 603 may mean a side surface corresponding to the direction in which the tray 600 is inserted into the socket 500 (refer to FIG. 5), and the first direction may correspond to the direction in which the tray 600 is inserted into the socket 500 (refer to FIG. 5).

According to an embodiment, the first protrusion 610 and the second protrusion 620 may be disposed side by side. For example, the second protrusion 620 may be formed on the first side surface 603 of the body portion 601 where the first protrusion 610 is formed. As an example, the first protrusion 610 and the second protrusion 620 may be formed on different side surfaces of the body portion 601. For example, the first protrusion 610 may be formed on the first side surface 603, and the second protrusion may be formed on the second side surface 604. In this case, the supporting portion (e.g., the supporting portion 560 of FIGS. 6 and 10) may be formed to correspond to the position of the second protrusion 620 when the tray 600 is inserted. For example, the supporting portion 560 may be formed in a side edge area of the socket 500.

According to an embodiment, the first protrusion 610 may contact at least a portion of the detection portion 540 (refer to FIGS. 6 to 10). For example, if the tray 600 is inserted into the socket 500, the first protrusion 610 may press the tray contact area (e.g., the tray contact area 543 of FIGS. 7 to 10). According to an embodiment, the outer surface 611 of the first protrusion 610 may be formed as a curved surface. Thus, the first protrusion 610 may smoothly slide on the tray contact area (the tray contact area 543 of FIGS. 7 to 10) so that the detection lever (e.g., the detection lever 540a of FIG. 7) may be prevented from damage.

According to an embodiment, the second protrusion 620 may include a contact surface 621. According to an embodiment, the second protrusion 620 may be received in a supporting portion (e.g., the supporting portion 560 of FIG. 10). For example, the contact surface 621 may contact a supporting area (e.g., supporting area 561 of FIG. 10), reducing the load applied by the first protrusion 610 to the tray contact area 543 (refer to FIGS. 5 to 8). Further, the contact surface 621 of the second protrusion 620 may contact the supporting area 561 (refer to FIG. 10), preventing the tray 600 from being further inserted into the socket 500. According to an embodiment, the second protrusion

620 may include a curved surface. For example, the whole or part of the second protrusion 620 may be formed as a curved surface. Thus, the supporting portion (e.g., the supporting portion 560 of FIG. 10) may be prevented from damage.

Figure 12:
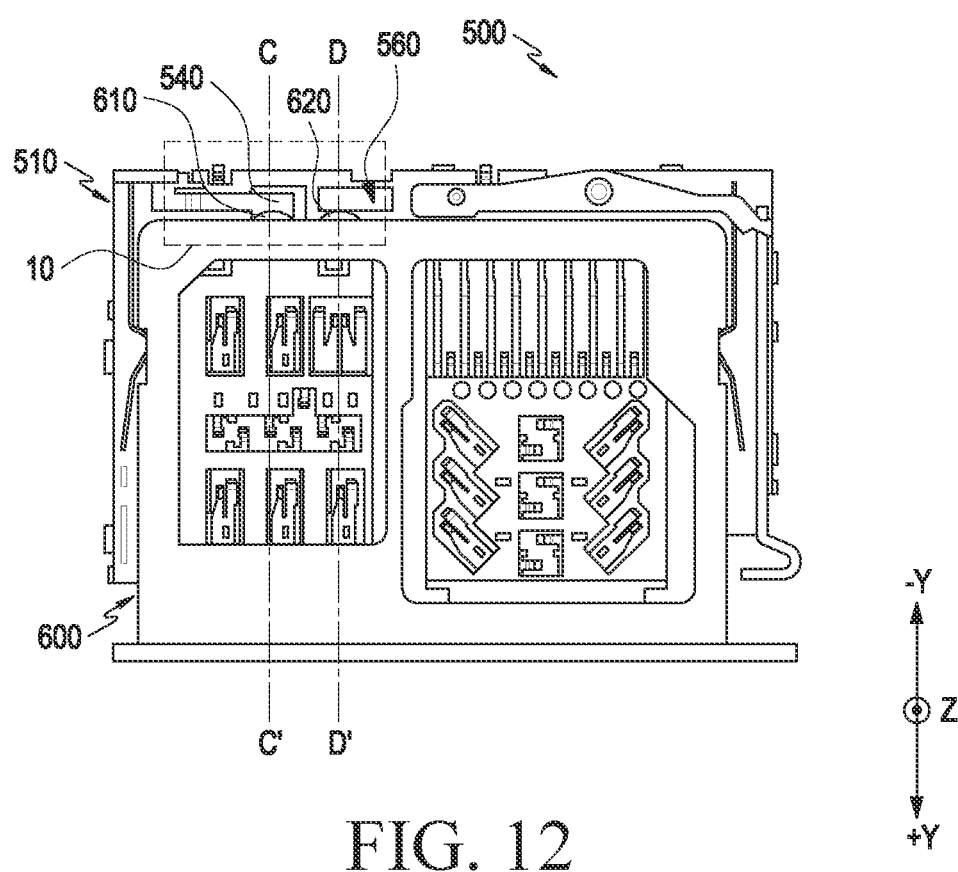
FIG. 12 is a view illustrating an overall state in which a tray is inserted in a socket according to an embodiment.

FIG. 12 is a view illustrating an overall state in which a tray is inserted in a socket according to an embodiment. FIG. 12 shows the various circuits of the socket 500 which are at the lower supporting member 510, accessible through the opening in the tray 600 from a side of the tray 600 at which the cover 520 is disposed.

Figure 13B:
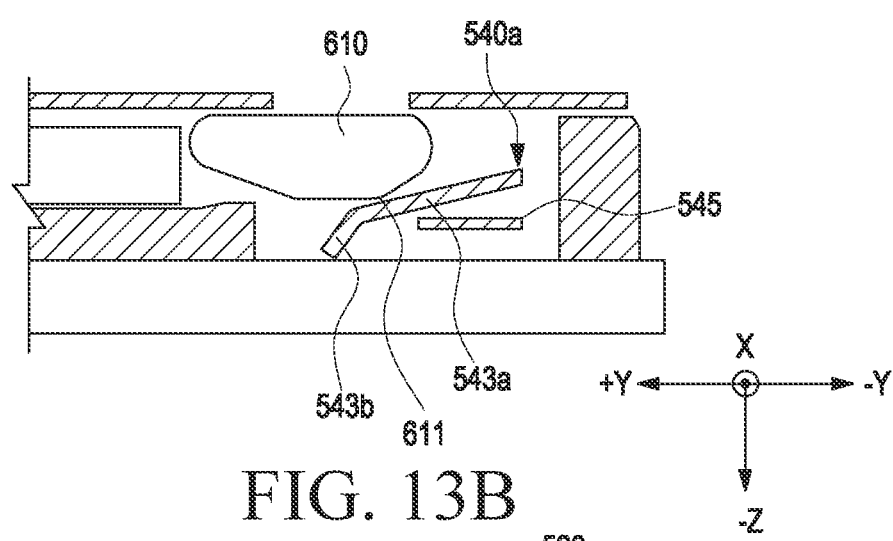
Figure 13C:
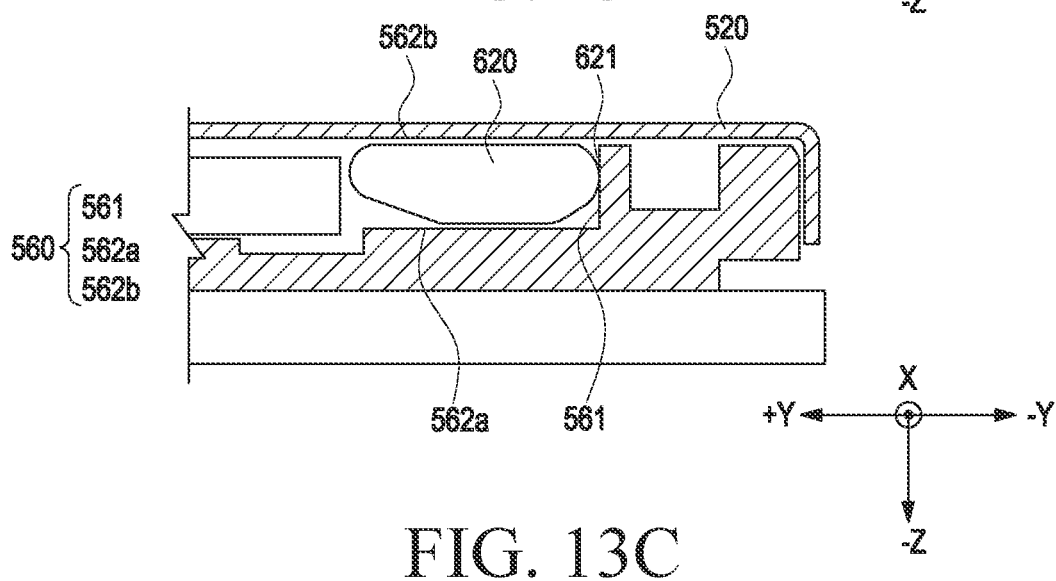

FIG. 13(*a*) is an enlarged plan view of area 10 in FIG. 12 illustrating the anti-breakage structure of FIG. 12. FIG. 13(*a*) illustrates a state in which the tray 600 is inserted in the socket 500. For convenience of description, the upper cover 520 (refer to FIG. 5) is not shown in FIGS. 12 and 13. FIG. 13(*b*) is a cross-sectional view taken along C-C' of FIG. 12. FIG. 13(*c*) is a cross-sectional view taken along D-D' of FIG. 12.

Referring to FIGS. 12 and FIGS. 13(*a*) to 13(*c*), according to an embodiment, the load distribution structure may be provided as a combined structure of the tray 600 and the socket 500. For example, the load distribution structure may be provided by a combination of the second protrusion 620 and the supporting portion 560. That is, the tray 600 inserted into the socket 500 provides the second protrusion 620 of the tray 600 engaged with the supporting portion 560 of the socket 500, to define the load distribution structure. The description of the trays 200 and 600 and the socket 500 of FIG. 12 may be applied to the tray 600 and socket 500 of FIG. 12.

According to an embodiment (FIG. 13(*b*)), the first protrusion 610 may induce operation of the detection lever 540*a*. According to an embodiment, the outer surface 611 of the first protrusion 610 may contact the tray contact area 543. According to an embodiment, the first protrusion 610 may press the tray contact area 543 in the first direction (e.g., the tray insertion direction (−y-axis direction)). For example, a first direction force (e.g., −Fy, refer to FIG. 8) may be applied to the tray contact area 543 due to the tray 600 being inserted in the first direction (−y-axis direction) and, as the slide area 543*b* has a predetermined angle with the extension area 543*a*, a second directional force (e.g., −Fz, refer to FIG. 8) may be applied to the tray contact area 543. Accordingly, the first protrusion 610 may induce rotation of the detection lever 540*a* in the third direction (e.g., the x-axis direction). Further, the first protrusion 610 may induce rotation of the detection lever 540*a* about the first axis (y-axis), and the detection area 544 may contact the detection member 545 (refer to FIGS. 8 and 9).

According to an embodiment (FIG. 13(*c*)), the second protrusion 620 may be received in the supporting portion 560. As described above, it has been described above that the first auxiliary area 562*a* and the second auxiliary area 562*b* may be combined to provide a space for receiving the second protrusion 620. According to an embodiment, the second protrusion 620 may be supported by the supporting area 561 in the first direction (−y-axis direction). For example, the contact surface 621 may contact at least a portion of the supporting area 561, and the load in the −y-axis direction of the tray 600 may be distributed to the supporting area 561. Thus, the displacement of the tray contact area 543 (e.g., rotational displacement about the X axis or vertical displacement about the −Z axis, refer to FIG. 8) may be limited, and deformation of the detection lever 540*a* may be reduced even when the tray 600 is inserted in the socket 500 for a long time. Further, in a state in which the tray 600 is fully inserted in the socket 500, the contact surface 621 may contact the supporting area 561, thereby preventing further insertion of the tray 600 and/or promoting alignment of the tray 600 relative to components of the socket 500. In an embodiment, the tray 600 which is inserted into the socket 500 disposes the portion of the tray corresponding to the second protrusion 620 supported in the first direction by the supporting portion 560, together with distributing the force in the first direction and the pressing force applied to the tray contact area by the first protrusion of the tray 600 along a thickness direction, thereby defining the load distribution structure.

Figure 14A:
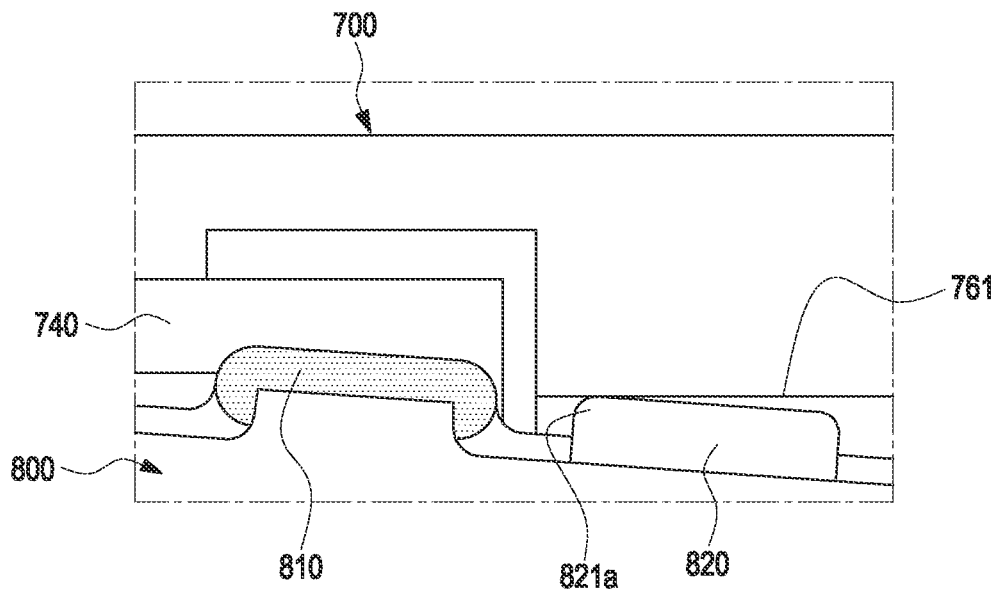
FIGS. 14(*a*) and 14(*b*) are plan views illustrating a combined structure of a tray and a socket according to an embodiment.
Figure 14B:
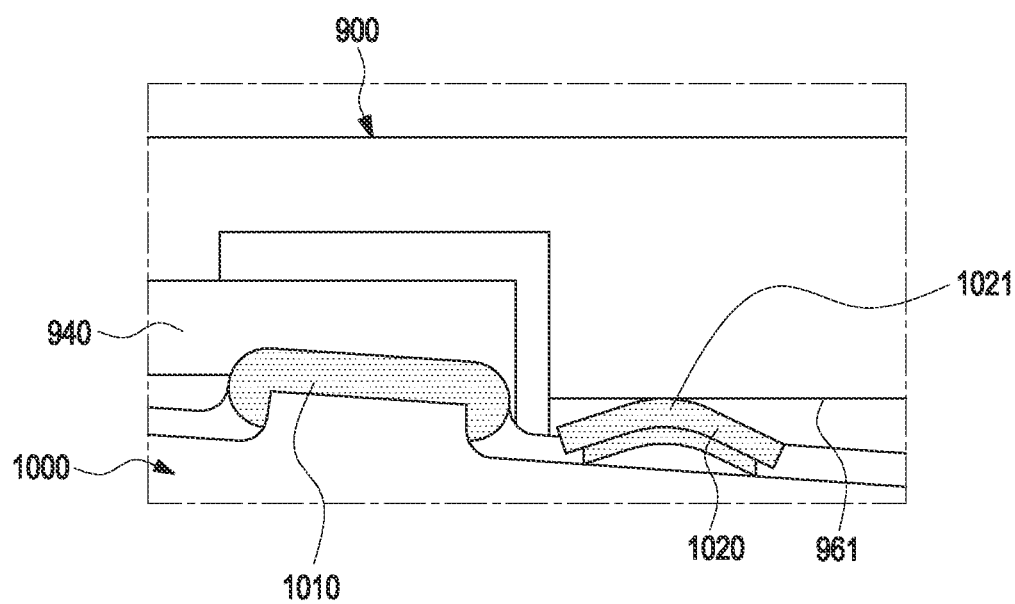

FIGS. 14(*a*) and 14(*b*) are views illustrating a combined structure of a tray and a socket according to an embodiment.

Referring to FIGS. 14(*a*) and 14(*b*), a tray 800 or 1000 may be tilt-assembled with a socket 700 or 900. According to an embodiment, the tray 800 or 1000 may be inserted obliquely into the socket 700 or 900. Alternatively, one side surface of the tray 800 or 1000 may be formed to have a predetermined angle with at least a portion of the socket 700 or 900.

The configuration of the tray 800 or 1000 and the socket 700 or 900 may be identical in whole or part to the configuration of the tray 600 and the socket 500 of the above-described embodiments, and thus no duplicate description thereof is given.

According to an embodiment, the first protrusion 810 or 1010 may press the detection portion 740 or 940 in an oblique direction. The description of the first protrusion (e.g., the first protrusion 610 of FIGS. 11(*a*) and 11(*b*)) according to the above-described embodiments may be applied to the first protrusions 810 and 1010.

According to an embodiment (refer to FIG. 14(*a*)), the second protrusion 820 may include a first area 821*a* having a rounded shape. For example, when the second protrusion 820 has a rectangular shape, vertices and/or corners of the second protrusion 820 may have a curved shape. Further, the first area 821*a* may contact the contact area 761.

According to an embodiment (refer to FIG. 14(*b*)), the second protrusion 1020 may be formed in a rounded shape. In an embodiment, a distal end of the second protrusion 1020 of the tray has a rounded shape. For example, the second protrusion 1020 having a rounded shape may include a second area 1021 which is a curved surface. The second area 1021 may contact the contact area 961.

According to various examples, a partial area (e.g., the first area 821*a* or the second area 1021) of the second protrusion (e.g., 820 or 1020) has a curved shape, so that when the second protrusion 820 or 1020 contacts the contact area 761 or 961, damage to the contact area 761 or 961 may be reduced.

Figure 15:
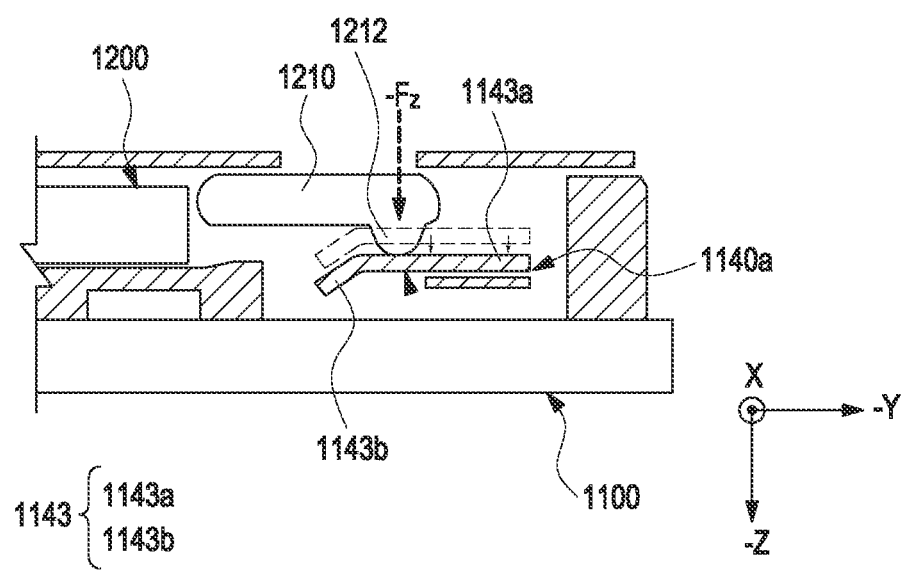
FIG. 15 is a cross-sectional view illustrating a combined structure of a tray and a socket according to an embodiment.

FIG. 15 is a view illustrating a combined structure of a tray and a socket according to an embodiment.

According to an embodiment, the tray 1200 may include a first protrusion 1210 in which a pressing area 1212 is formed.

The configuration of the tray 1200 of FIG. 15 is identical or similar in whole or part to the configuration of the trays 200, 600, 800, and 1000 of the above-described embodiments, and no duplicate description thereof is thus given.

Referring to FIG. 15, the first protrusion 1210 may include a pressing area 1212 on one side thereof. For example, the pressing area 1212 may be formed to protrude from one side (−y-axis direction) of the first protrusion 1210. The pressing area 1212 may be formed to protrude in a direction different from the direction in which the tray 1200 is inserted into the socket 1100 (e.g., the −y-axis direction).

For example, the pressing area 1212 may be formed in a direction (e.g., −z-axis direction) perpendicular to the direction in which the tray 1200 is inserted into the socket 1100 (e.g., the y-axis direction). According to an embodiment, the pressing area 1212 may include a curved shape. For example, the pressing area 1212 may be formed to protrude from one side of the first protrusion 1210 in an embossed form.

According to an embodiment, the pressing area 1212 may press the tray contact area 1143 in a direction (e.g., −z-axis direction) perpendicular to the direction (e.g., the −y-axis direction) in which the tray 1143 is inserted. According to an embodiment, the pressing area 1212 may press a predetermined area within the tray contact area 1143. For example, the predetermined area may be the extension area 1143a. Alternatively, the predetermined area may be a portion of a length area (e.g., the length area 541 of FIG. 7) corresponding to the slide area 1143b. According to an embodiment, the pressing area 1212 may press the tray contact area 1143 in the −z-axis direction and/or press a predetermined area (e.g., the extension area 1143a) of the tray contact area 1143 in the −z-axis direction, so that the detection lever 1140a may be overall moved in the −z-axis direction. Thus, the first rotational moment (e.g., refer to FIG. 8) about the x-axis direction acting on the detection lever 1140a may be reduced, and damage or deformation of the detection lever 1140a may be reduced.

Figure 16A:
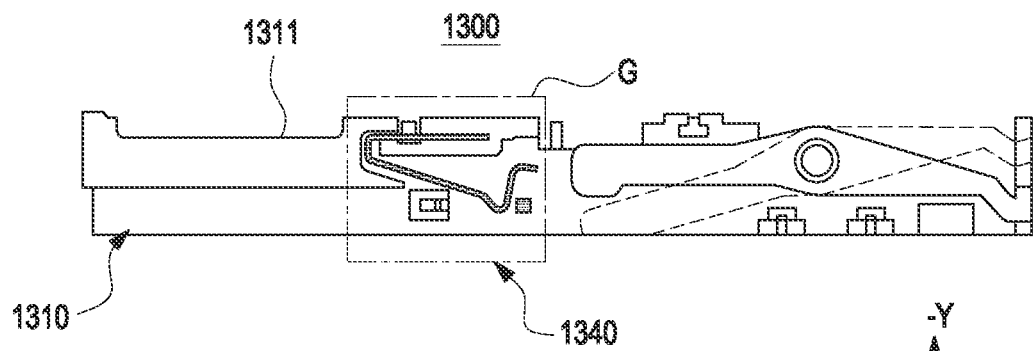
FIG. 16(*a*) illustrates a plan view of a detection portion according to an embodiment.
Figure 16B:
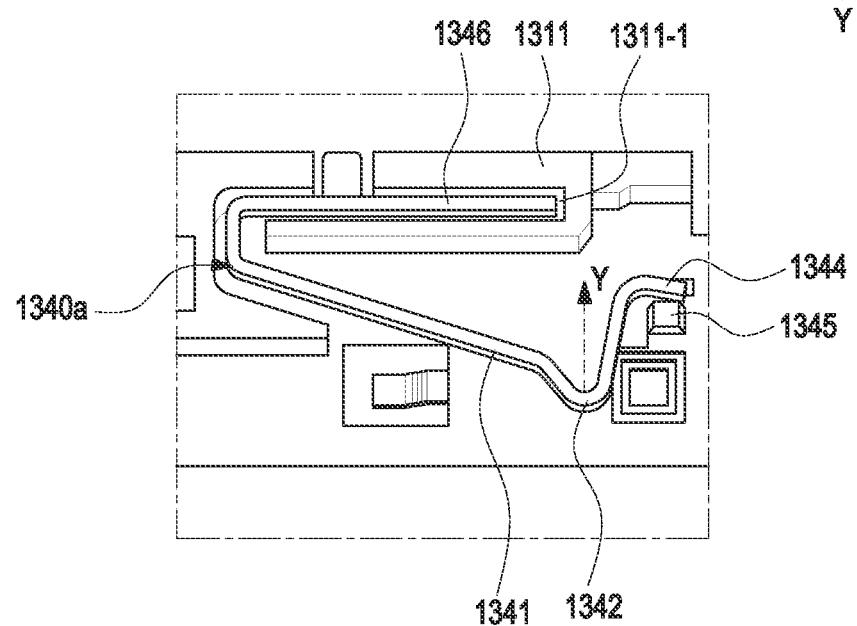

FIGS. 16(a) and 16(b) illustrate a detection portion according to an embodiment.

Referring to FIGS. 16(a) and 16(b), according to an embodiment, a socket 1300 may include a lower supporting member 1310 and a detection portion 1340 disposed on the lower supporting member 1310. Although not shown for convenience of description, the socket 1300 may include an upper cover (not shown). According to an embodiment, the detection portion 1340 may include a detection lever 1340a and a detection member 1345. The description of the sockets 500, 700, 900 and 1100 of the above-described embodiments may be applied to the socket 1300 of FIGS. 16(a) and 16(b).

According to an embodiment, the detection lever 1340a may include a supporting area 1346 disposed on the lower supporting member 1310. According to an embodiment, the supporting area 1346 may be disposed in the lever receiving space 1311-1 formed in the edge area 1311 of the lower supporting member 1310.

According to an embodiment, the detection lever 1340a may include a length area 1341 extending from the supporting area 1346. According to an embodiment, the length area 1341 may be formed to be bent from the supporting area 1346. According to an embodiment, the detection lever 1340a may be formed of an elastic material, and the length area 1341 may provide a restoring force when an external force acts on the detection lever 1340a.

According to an embodiment, the detection lever 1340a may include a tray contact area 1342 extending from the length area 1341. The tray contact area 1342 may be formed to protrude outward (e.g., in the +y-axis direction) of the detection lever 1340a. According to an embodiment, the tray contact area 1342 may be pressed by an external force. For example, the tray contact area 1342 may protrude in a direction (+y-axis direction) opposite to the tray insertion direction (−y-axis direction) and be pressed by the tray (e.g., the tray 1400 of FIGS. 17(a) and 17(b)) and induce the operation of the detection lever 1340a.

According to an embodiment, the detection lever 1340a may include a detection area 1344 extending from the tray contact area 1342. According to an embodiment, the detection area 1344 may contact or be spaced apart from the detection member 1345 depending on whether an external force is applied. For example, if an external force is applied to the tray contact area 1342, the detection area 1344 may be spaced apart from the detection member 1345, and if the external force on the tray contact area 1342 is removed, the detection area 1344 may come into contact with the detection member 1345 according to the restoring force. According to an embodiment, the detection member 1345 may be electrically connected to a printed circuit board (e.g., the printed circuit board 340 of FIG. 4) and detect whether the tray is mounted depending on whether it is in contact with the tray contact area 1342.

Figure 17A:
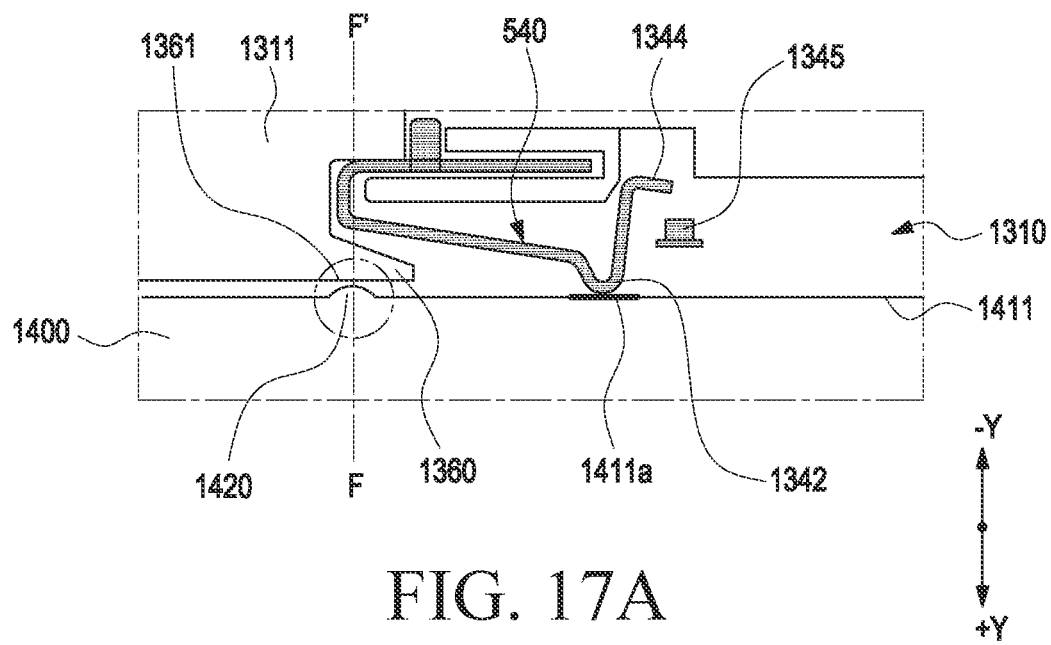
FIG. 17(*a*) is a plan view and FIG. 17(*b*) is a cross-sectional view, illustrating a coupling relationship between a detection portion and a tray as shown in FIGS. 16(*a*) and 16(*b*)
Figure 17B:
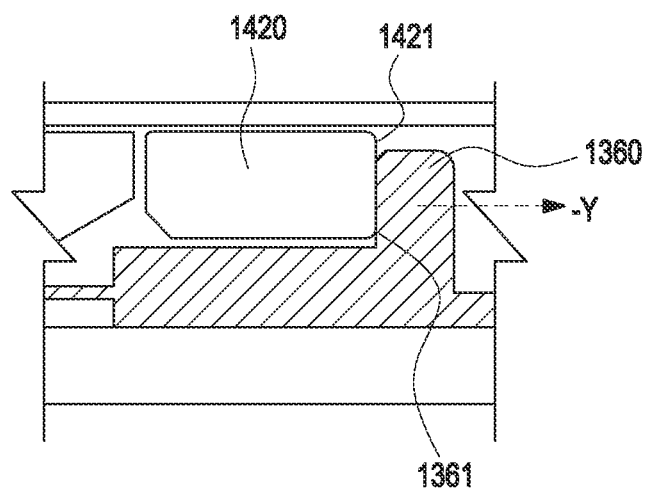

FIGS. 17(a) and 17(b) is a view illustrating a coupling relationship between a detection portion and a tray as shown in FIG. 16(a). FIG. 17(a) illustrates the coupling relationship between the tray 1400 and the socket 1300 as viewed from thereabove. FIG. 17(b) illustrates a cross section taken along F-F' of (a).

Referring to FIGS. 17(a) and 17(b), the tray 1400 may include a pressing surface 1411 and a supporting protrusion 1420. According to an embodiment, the pressing surface 1411 may mean one surface of the tray 1400 facing in the tray insertion direction (e.g., −y-axis direction). According to an embodiment, at least a portion of the pressing surface 1411 may be a pressing area 1411a for pressing the tray contact area 1342. According to an embodiment, a supporting protrusion 1420 may be formed on at least a portion of the pressing surface 1411 to protrude along the tray insertion direction (e.g., −y-axis direction). The description of the trays 600, 800, 1000, and 1200 and the sockets 500, 700, 900, and 1100 mentioned above may be applied to the tray 1400 and socket 1300 of FIGS. 17(a) and 17(b).

According to an embodiment, the pressing area 1411a may press the tray contact area 1342 in the tray insertion direction (e.g., the −y-axis direction). If the tray contact area 1342 is pressed by the pressing area 1411a, the detection area 1344 may be spaced apart from the detection member 1345.

According to an embodiment, the lower supporting member 1310 may include a supporting portion 1360. According to an embodiment, the supporting portion 1360 may mean a portion of the edge area 1311 of the lower supporting member 1310. Further, the supporting portion 1360 may be disposed adjacent to the detection portion 1340. For example, the supporting portion 1360 may be a portion of an edge barrier rib 1311 of the lower supporting member 1310 surrounding at least a portion of the detection lever 1340a.

According to an embodiment, the contact surface 1421 of the supporting protrusion 1420 may contact the supporting area 1361 of the supporting portion 1360. For example, the supporting area 1361 may support the contact surface 1421 in the tray insertion direction (e.g., the −y-axis direction). Thus, the load applied to the tray contact area 1342 by the pressing area 1411a may be reduced, and deformation of the detection lever 1340a may be reduced.

Figure 18:
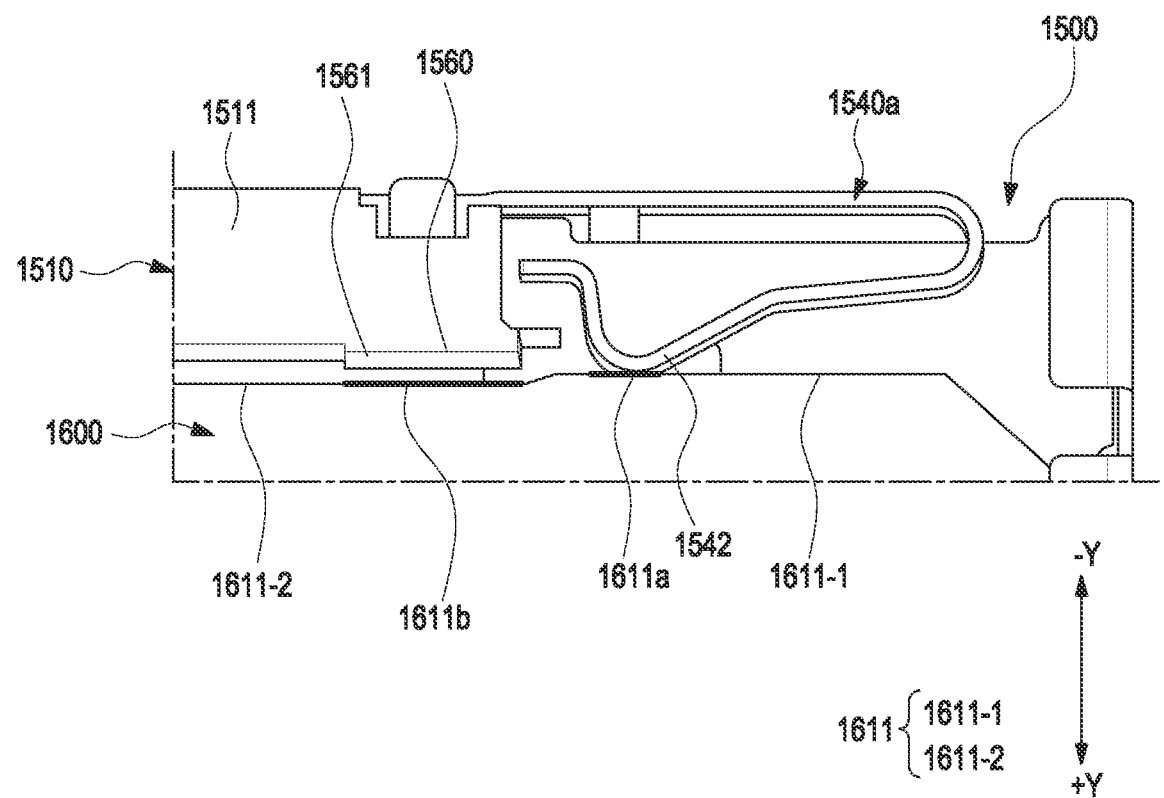
FIG. 18 is a view illustrating a coupling relationship between a detection portion and a tray according to an embodiment.

FIG. 18 is a view illustrating a coupling relationship between a detection portion and a tray according to an embodiment.

Referring to FIG. 18, the socket 1500 may include a detection portion 1540 and a supporting portion 1560. The detection portion 1540 of FIG. 18 is identical or similar in whole or part to the detection portion 1340 of FIGS. 16 and 17, and no duplicate description thereof is thus given.

According to an embodiment, the supporting portion 1560 may be formed in the edge area 1511 of the lower supporting member 1510. It has been described above that the edge area 1511 may be formed of a barrier rib 1511. According to an embodiment, the supporting portion 1560 may be formed as a portion of the edge area 1511 protrudes. For example, the supporting portion 1560 may be formed as the barrier rib 1511 of the lower supporting member 1510 protrudes in a direction (y-axis direction) opposite to the tray insertion direction (−y-axis direction). Further, the supporting portion 1560 may be formed to protrude from an edge area (barrier rib) 1511 disposed adjacent to the detection portion 1540.

According to an embodiment, the tray 1600 may include a pressing area 1611a and a contact area 1611b. According to an embodiment, the pressing area 1611a and the contact area 1611b may be formed on the pressing surface 1611 formed to face in the insertion direction (−y-axis direction) of the tray 1600. According to an embodiment, the pressing surface 1611 may include a first portion 1611-1 where the pressing area 1611a is formed and a second portion 1611-2 where the contact area 1611b is formed. For example, the first portion 1611-1 may be formed to protrude in the tray insertion direction (−y-axis direction) further than the second portion 1611-2. Since the operation of the detection portion 1540 by the pressing area 1611a is similar to the operation of the detection portion 1340 by the pressing area 1411a of FIG. 16, no duplicate description thereof is thus given.

According to an embodiment, the contact area 1611b may contact the supporting area 1561 of the supporting portion 1560. According to an embodiment, the supporting area 1561 may mean one surface of the supporting portion 1560 facing the contact area 1611b in a state in which the tray 1600 is inserted. The contact area 1611b may be supported by the supporting area 1561 in the tray insertion direction (e.g., the −y-axis direction) so that the load applied to the tray contact area 1542 by the pressing area 1611a may be reduced.

According to an embodiment, there may be provided an electronic device including a circuit board (e.g., the printed circuit board 340 of FIG. 4), a socket (e.g., the socket 341 of FIG. 4) disposed on the circuit board, and a tray (e.g., the tray 200 of FIG. 4) removably insertable into the socket, where the socket includes a detection portion (e.g., the detection portion 540 of FIG. 6) for detecting insertion of the tray and a supporting portion (e.g., the supporting portion 560 of FIG. 10) for supporting at least a portion of the tray, and where the tray includes a body portion, a first protrusion (e.g., the first protrusion 610 of FIGS. 11(a) and 11(b)) extended from the body portion to contact the detection portion, and a second protrusion (e.g., the second protrusion 620 of FIGS. 11(a) and 11(b)) extended from the body portion to be supported by the supporting portion.

According to an embodiment, the body portion may include a receiving space for receiving a storage medium.

According to an embodiment, the storage medium may include at least any one of a SIM card or an SD card.

According to an embodiment, the tray may be inserted into the socket along a first direction, and the first protrusion and the second protrusion may be extended from a side surface of the body portion According to an embodiment, the first protrusion and the second protrusion may be disposed in parallel with each other.

According to an embodiment, the detection portion may include a tray contact area (e.g., the tray contact area 543 of FIG. 7). The at least a portion of the tray contact is formed obliquely from the first direction. The first protrusion may be configured to press the tray contact area.

According to an embodiment, the tray contact area may include a first area (e.g., the extension area 543a of FIG. 7) extending from one side of the detection portion along the first direction and a second area (e.g., the slide area 543b of FIG. 7) bent and extending from the first area.

According to an embodiment, if the tray contact area is pressed by the first protrusion, a force in the first direction and a force in a second direction perpendicular to the first direction act on the detection portion.

According to an embodiment, the supporting portion may be configured to support the second protrusion in the first direction to distribute the forces acting on the detection portion by the first protrusion.

According to an embodiment, at least a portion of the second protrusion may have a rounded shape.

According to an embodiment, the supporting portion may be disposed in an edge area of the socket.

According to an embodiment, the supporting portion may be disposed in parallel with the detection portion.

According to an embodiment, there may be provided a tray-socket combined structure including a socket configured to be mounted in an electronic device, and a tray configured to be inserted into the socket, where the socket includes a lower supporting member (e.g., the lower supporting member 510 of FIG. 5) including a supporting portion in at least a portion thereof, a detection portion (e.g., the detection portion 540 of FIG. 6) disposed on the lower supporting member, and an upper cover (e.g., the upper cover 520 of FIG. 6) disposed on the lower supporting member to provide a tray insertion opening, and where the tray includes a body portion, a first protrusion (e.g., the first protrusion 610 of FIGS. 11(a) and 11(b)) formed to extend from the body portion to contact the detection portion, and a second protrusion (e.g., the second protrusion 620 of FIGS. 11(a) and 11(b)) formed to extend from the body portion, and where the supporting portion is formed to protrude from a portion of the lower supporting member.

According to an embodiment, the supporting portion may be formed of a barrier rib near an edge area of the lower supporting member.

According to an embodiment, the first protrusion and the second protrusion may be formed in parallel with each other.

According to an embodiment, the detection portion and the supporting portion may be disposed adjacent to each other.

According to an embodiment, the supporting portion may include a supporting surface for supporting the second protrusion. The supporting surface may be formed to be perpendicular to an insertion direction of the tray.

According to an embodiment, at least a portion of the second protrusion may have a rounded shape.

According to an embodiment, the body portion may include a receiving space for receiving a storage medium.

According to an embodiment, the storage medium may include at least any one of a SIM card or an SD card.

While the present disclosure has been shown and described with reference to embodiments thereof, it will be apparent to those of ordinary skill in the art that various changes in form and detail may be made thereto without departing from the spirit and scope of the present disclosure as defined by the following claims.

What is claimed is:
1. An electronic device comprising:
a circuit board;
a socket on the circuit board and electrically connected to the circuit board; and a tray removably insertable into the socket from outside the electronic device, the tray including a body portion, a first protrusion extending from the body portion, and a second protrusion extending from the body and spaced apart from the first protrusion;

wherein the tray is insertable into the socket along a first direction, the first protrusion and the second protrusion extend in the first direction and are disposed side by side, the socket includes:

a detection portion which is engageable with the first protrusion of the tray and detects insertion of the tray in the socket, together with the circuit board, and a supporting portion which is engageable with the second protrusion of the tray, and the tray which is inserted into the socket disposes:

the first protrusion contacting the detection portion, and a portion of the tray corresponding to the second protrusion supported by the supporting portion.

2. The electronic device of claim 1, wherein the body portion of the tray defines a receiving space in which a storage medium is received.

3. The electronic device of claim 2, wherein the storage medium includes a SIM card or an SD card.

4. The electronic device of claim 2, wherein the first protrusion and the second protrusion of the tray are extended in the first direction from a side surface of the body portion.

5. The electronic device of claim 4, wherein the first protrusion and the second protrusion of the tray are extended parallel with each other.

6. The electronic device of claim 4, wherein the detection portion of the socket includes a tray contact area along which the tray is slidably engageable, a portion of the tray contact area extended obliquely along a thickness direction of the electronic device, and the tray which is inserted into the socket slides along the tray contact area and displaces the detection portion along the thickness direction.

7. The electronic device of claim 6, wherein the tray contact area includes:

a first area extending along the first direction, from a side of the detection portion, and a second area obliquely bent from the first area.

8. The electronic device of claim 6, wherein the tray which is inserted into the socket engages the first protrusion with the tray contact area to press the tray contact area, and pressing of the tray contact area by the first protrusion of the tray applies a force in the first direction to the detection portion of the socket, together with a pressing force in the thickness direction to the detection portion.

9. The electronic device of claim 8, wherein the tray which is inserted into the socket disposes the portion of the tray corresponding to the second protrusion contacting the supporting portion in the first direction, together with distributing the force and the pressing force applied to the tray contact area by the first protrusion of the tray.

10. The electronic device of claim 1, wherein a distal end of the second protrusion of the tray has a rounded shape.

11. The electronic device of claim 1, wherein the socket defines a tray insertion opening through which the tray is insertable, and the supporting portion of the socket is located in an edge area of the socket which is furthest from the tray insertion opening.

12. The electronic device of claim 1, wherein the supporting portion of the socket is parallel with the detection portion of the socket.

13. A tray-socket combined structure comprising:

a socket mountable in an electronic device; and a tray removably insertable into the socket from outside the electronic device, the tray including a body portion, a first protrusion extending from the body portion, and a second protrusion extending from the body and spaced apart from the first protrusion;

wherein the tray is insertable into the socket along a first direction, the first protrusion and the second protrusion extend in the first direction and are disposed side by side, the socket includes:

a lower supporting member including a supporting portion engageable with the second protrusion of the tray;

an upper cover facing the lower supporting member to provide a tray insertion opening through which the tray is removably insertable into the socket; and a detection portion disposed on the lower supporting member and engageable with the first protrusion of the tray to detect insertion of the tray in the socket, the tray which is inserted into the socket disposes:

the first protrusion contacting the detection portion, and a portion of the tray corresponding to the second protrusion supported by the supporting portion.

14. The tray-socket combined structure of claim 13, wherein the supporting portion of the socket is in an edge area of the lower supporting member which is furthest from the tray insertion opening.

15. The tray-socket combined structure of claim 13, wherein the first protrusion and the second protrusion of the tray are parallel with each other.

16. The tray-socket combined structure of claim 13, wherein within the socket, the detection portion and the supporting portion are adjacent to each other.

17. The tray-socket combined structure of claim 13, wherein the supporting portion of the socket includes a supporting surface perpendicular to the first direction, and the tray which is inserted into the socket disposes the second protrusion of the tray supported in the first direction, by the supporting surface.

18. The tray-socket combined structure of claim 13, wherein a distal end of the second protrusion of the tray has a rounded shape.

19. The tray-socket combined structure of claim 13, wherein the body portion of the tray defines a receiving space in which a storage medium is received.

20. The tray-socket combined structure of claim 19, wherein the storage medium includes a SIM card or an SD card.

* * * * *